US011695025B2

(12) United States Patent
Jang

(10) Patent No.: US 11,695,025 B2
(45) Date of Patent: *Jul. 4, 2023

(54) IMAGE SENSOR

(71) Applicant: SK hynix Inc., Icheon-si (KR)

(72) Inventor: Jae Hyung Jang, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 198 days.

This patent is subject to a terminal disclaimer.

(21) Appl. No.: 17/069,548

(22) Filed: Oct. 13, 2020

(65) Prior Publication Data

US 2021/0288088 A1 Sep. 16, 2021

(30) Foreign Application Priority Data

Mar. 11, 2020 (KR) .................. 10-2020-0030361

(51) Int. Cl.
*H01L 27/146* (2006.01)
(52) U.S. Cl.
CPC .. *H01L 27/14612* (2013.01); *H01L 27/14603* (2013.01); *H01L 27/14636* (2013.01)

(58) Field of Classification Search
CPC ......... H01L 27/14612; H01L 27/14603; H01L 27/14636
See application file for complete search history.

(56) References Cited

U.S. PATENT DOCUMENTS 11,363,224 B2 * 6/2022 Jang ................. G01S 17/894

FOREIGN PATENT DOCUMENTS

JP 2018-117117 A 7/2018
KR 10-2019-0088457 A 7/2019

* cited by examiner

*Primary Examiner* — David A Zarneke
(74) *Attorney, Agent, or Firm* — Perkins Coie LLP

(57) ABSTRACT

An image sensor includes a detection region, a first transistor region, and a second transistor region. The detection region including a first demodulation node and a second demodulation node generates a hole current in a substrate, and captures photocharges that are generated by incident light and move by the hole current. The first pixel transistor region including a plurality of transistors is disposed at one side of the detection region, and processes photocharges captured by the first demodulation node. The second pixel transistor region including a plurality of transistors is disposed at other side of the detection region, and processes photocharges captured by the second demodulation node.

20 Claims, 11 Drawing Sheets

IMAGE SENSOR

CROSS-REFERENCE TO RELATED APPLICATION

This patent document claims priority based upon Korean patent application No. 10-2020-0030361, filed on Mar. 11, 2020, the disclosure of which is incorporated in its entirety by reference herein.

TECHNICAL FIELD

The technology and implementations disclosed in this patent document generally relate to an image sensor for sensing a distance to a target object.

BACKGROUND

An image sensor is a device for capturing at least one image using semiconductor characteristics that react to light incident thereon to produce an image. Recently, with the increasing development of computer industries and communication industries, demand for high-quality and high-performance image sensors has been rapidly increasing in various electronic devices, for example, smartphones, digital cameras, game consoles, Internet of Things (IoT), robots, surveillance cameras, medical micro-cameras, etc.

Image sensors may be broadly classified into CCD (Charge Coupled Device) image sensors and CMOS (Complementary Metal Oxide Semiconductor) image sensors. CCD image sensors may be superior to the CMOS image sensor in terms of noise and image quality. However, CMOS image sensor have a simpler and more convenient driving scheme, and thus may be preferred in some applications. CMOS image sensors may integrate a signal processing circuit in a single chip, making it easy to miniaturize the sensors for implementation in a product, with the added benefit of consuming lower power consumption. CMOS image sensors can be fabricated using a CMOS fabrication technology, which results in low manufacturing cost. CMOS image sensors have been widely used due to their suitability for implementation in mobile devices.

There have been much developments and studies for measuring range and depth (i.e., a distance to a target object) using image sensors. For example, demand for the technologies of measuring range and depth have been rapidly increasing in various devices, for example, security devices, medical devices, automobiles, game consoles, virtual reality (VR)/augmented reality (AR) devices, mobile devices, etc. Methods for measuring depth information using one or more image sensors are mainly classified into a triangulation method, a Time of Flight (TO F) method, and an interferometry method. Among above-mentioned depth measurement methods, the Time of Flight (TOF) method becomes popular because of its wide range of utilization, high processing speed, and cost advantages. The TOF method measures a distance using emitted light and reflected light. The TOF method may be mainly classified into two different types, i.e., a direct method and an indirect method, depending on whether it is a round-trip time or the phase difference that determines the distance. The direct method may calculate a round trip time using emitted light and reflected light and measure the distance (i.e., depth) to the target object using the calculated round trip time. The indirect method may measure the distance to the target object using a phase difference. The direct method is suitable for measuring a long-distance measurement and thus is widely used in automobiles. The indirect method is suitable for measuring a short-distance measurement and thus is widely used in various higher-speed devices designed to operate at a higher speed, for example, game consoles, mobile cameras, or others. As compared to the direct type ToF systems, the indirect method have several advantages, including having simpler circuitry, low memory requirement, and a relatively low cost.

A Current-Assisted Photonic Demodulator (CAPD) method is one type of pixel circuitry used in an indirect ToF sensor. In CAPD, electrons are generated in a pixel circuit by a majority current that is created through an application of a substrate voltage, and the generated electrons are detected by using a difference in potential between electric fields. Since the CAPD method is designed to use the majority current, the CAPD method can more quickly detect electrons. In addition, the CAPD has an excellent efficiency by detecting some electrons formed at a deep depth.

SUMMARY

Various embodiments of the disclosed technology relate to an image sensor provided with pixels optimized in structure for miniaturization.

In accordance with an embodiment of the disclosed technology, an image sensor may include a detection region including a first demodulation node and a second demodulation node, and configured to generate an electrical current in a substrate and capture photocharges that are generated by incident light and move by the hole current, a first pixel transistor region including a plurality of transistors, disposed at one side of the detection region, and configured to process photocharges captured by the first demodulation node, and a second pixel transistor region including a plurality of transistors, disposed at other side of the detection region, and configured to process photocharges captured by the second demodulation node.

In accordance with another embodiment of the disclosed technology, an image sensor may include a first pixel and a second pixel located contiguous to the first pixel. Each of the first pixel and the second pixel may include a detection region including a first demodulation node and a second demodulation node, and configured to generate an electrical current in a substrate and capture photocharges that are generated by incident light and move by the hole current, a first pixel transistor region including a plurality of transistors, disposed at one side of the detection region, and configured to process photocharges captured by the first demodulation node, and a second pixel transistor region including a plurality of transistors, disposed at other side of the detection region, and configured to process photocharges captured by the second demodulation node. The detection region, the first pixel transistor region, and the second pixel transistor region of the first pixel may be arranged symmetrical to the detection region, the first pixel transistor region, and the second pixel transistor region of the second pixel with respect to a boundary between the first pixel and the second pixel.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
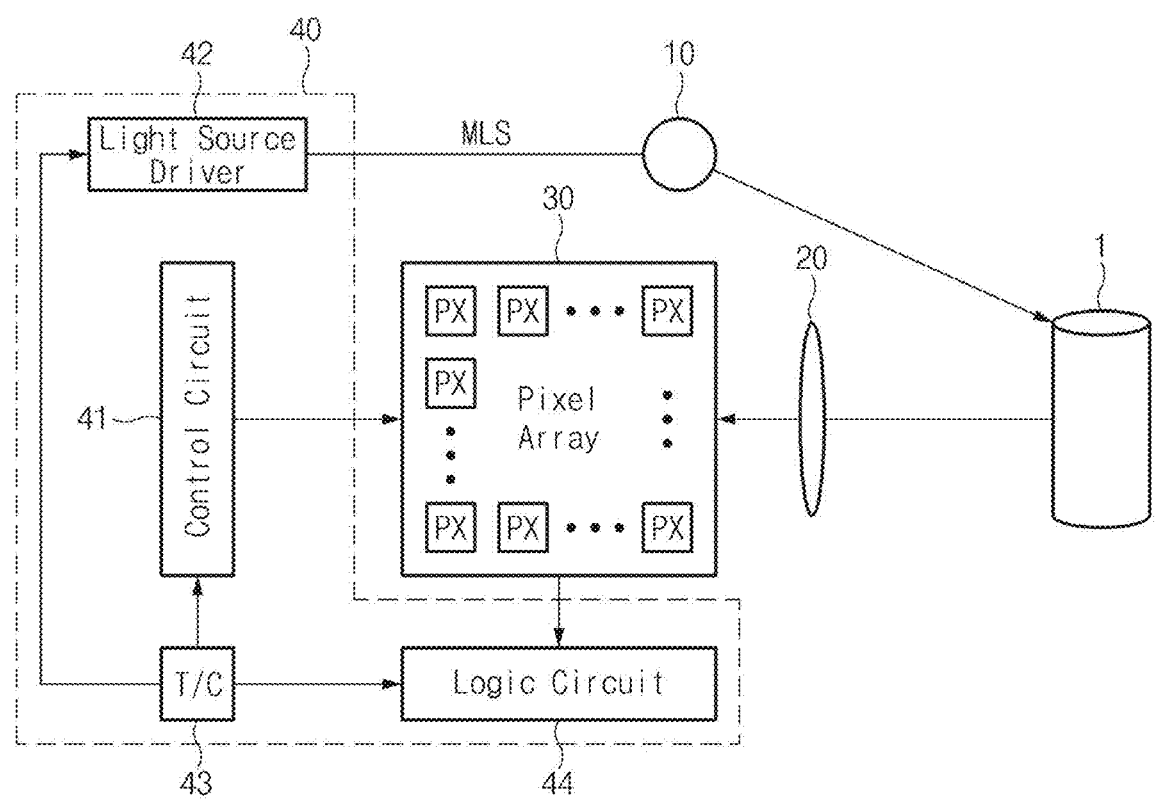
FIG. 1 is a block diagram illustrating an example of an image sensor based on some implementations of the disclosed technology.

This patent document provides implementations and examples of an image sensor that substantially addresses one or more issues due to limitations and disadvantages of the related art. Some implementations of the disclosed technology relate to the image sensor provided with pixels optimized in structure for miniaturization. In recognition of the issues above, the disclosed technology provides various implementations of an image sensor which enables the first pixel transistor region and the second pixel transistor region included in the CAPD pixel to be disposed at the respective sides such that the first pixel transistor region is disposed at one side of the CAPD pixel and the second pixel transistor region is disposed at the other side of the CAPD pixel. As a result, mutual interference between the first pixel transistor region and the second pixel transistor pixel can be minimized, and the deterioration of the performance (or throughput) of pixels can be prevented even with the reduction of the pixel size.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

FIG. 1 is a block diagram illustrating an example of an image sensor based on some implementations of the disclosed technology.

Referring to FIG. 1, the image sensing device may measure the distance to a target object 1 using the Time of Flight (TOF) method. The image sensing device may include a light source 10, a lens module 20, a pixel array 30, and a control block 40.

The light source 10 may emit light to a target object 1 upon receiving a clock signal MLS (modulated light signal) from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 100 may emit infrared light having a wavelength of 800 nm to 1000 nm. Light emitted from the light source 10 may be light (i.e., modulated light) modulated by a predetermined frequency. Although FIG. 1 shows only one light source 10 for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) structure in which unit pixels are arranged both in a column direction and in a row direction perpendicular to the column direction. The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may not indicate the color of the target object 1, and may be a signal indicating the distance to the target object 1. Each unit pixel (PX) may be a Current-Assisted Photonic Demodulator (CAPD) pixel. The structure and operations of each unit pixel (PX) will hereinafter be described with reference to the drawings from FIG. 2.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a control circuit 41, a light source driver 42, a timing controller (T/C) 43, and a logic circuit 44.

The control circuit 41 may drive unit pixels (PXs) of the pixel array in response to a timing signal generated from the timing controller 43. For example, the control circuit 41 may generate a control signal capable of selecting and controlling at least one row line from among the plurality of row lines. The control signal may include a demodulation control signal for generating a hole current in the substrate, a reset signal for controlling a reset transistor, a transmission (Tx)

signal for controlling transmission of photocharges accumulated in a detection node, a floating diffusion (FD) signal for providing additional electrostatic capacity at a high illuminance level, a selection signal for controlling a selection transistor, and the like. Although FIG. 1 illustrates the control circuit 41 arranged in a column direction (i.e., a vertical direction) of the pixel array 30 for convenience of description, at least some parts (e.g., a circuit for generating a demodulation control signal) of the control circuit 41 may be arranged in a row direction (i.e., a horizontal direction) of the pixel array 30.

The light source driver 42 may generate a clock signal MLS capable of driving the light source 10 in response to a control signal from the timing controller 43. The clock signal MLS may be a signal that is modulated by a predetermined frequency.

The timing controller 43 may generate a timing signal to control the control circuit 41, the light source driver 42, and the logic circuit 44.

The logic circuit 44 may process pixel signals received from the pixel array 30 under control of the timing controller 43, and may thus generate pixel data formed in a digital signal shape. To this end, the logic circuit 44 may include a correlated double sampler (CDS) circuit for performing correlated double sampling (CDS) on the pixel signals generated from the pixel array 30. In addition, the logic circuit 44 may include an analog-to-digital converter (ADC) for converting output signals of the CDS circuit into digital signals. In addition, the logic circuit 44 may include a buffer circuit that temporarily stores pixel data generated from the analog-to-digital converter (ADC) and outputs the pixel data under control of the timing controller 43. In the meantime, since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensor. The image sensor may sense modulated light (i.e., incident light) reflected from the target objects 1 included in the scene, and may thus generate depth information for each unit pixel (PX). A time delay based on the distance between the image sensor and each target object 1 may occur between the modulated light and the incident light. The time delay may be denoted by a phase difference between the signal generated by the image sensor and the clock signal MLS controlling the light source 10. An image processor (not shown) may calculate a phase difference generated in the output signal of the image sensor, and may thus generate a depth image including depth information for each unit pixel (PX).

The image sensor in FIG. 1 can be implemented in various embodiments. For example, one implementation of the image sensor in FIG. 1 can be structured to include pixels structured to receive and detect light to capture images carried by the detected light. Each pixel includes a detection region structured to include a first demodulation node and a second demodulation node to generate an electric current in a substrate and capture photocharges that are generated in response to incident light in the substrate and move along the electric current; a first pixel transistor region disposed at one side of the detection region, and configured to include a plurality of transistors processing the photocharges captured by the first demodulation node; and a second pixel transistor region disposed at other side of the detection region, and configured to include a plurality of transistors processing the photocharges captured by the second demodulation node.

Figure 2:
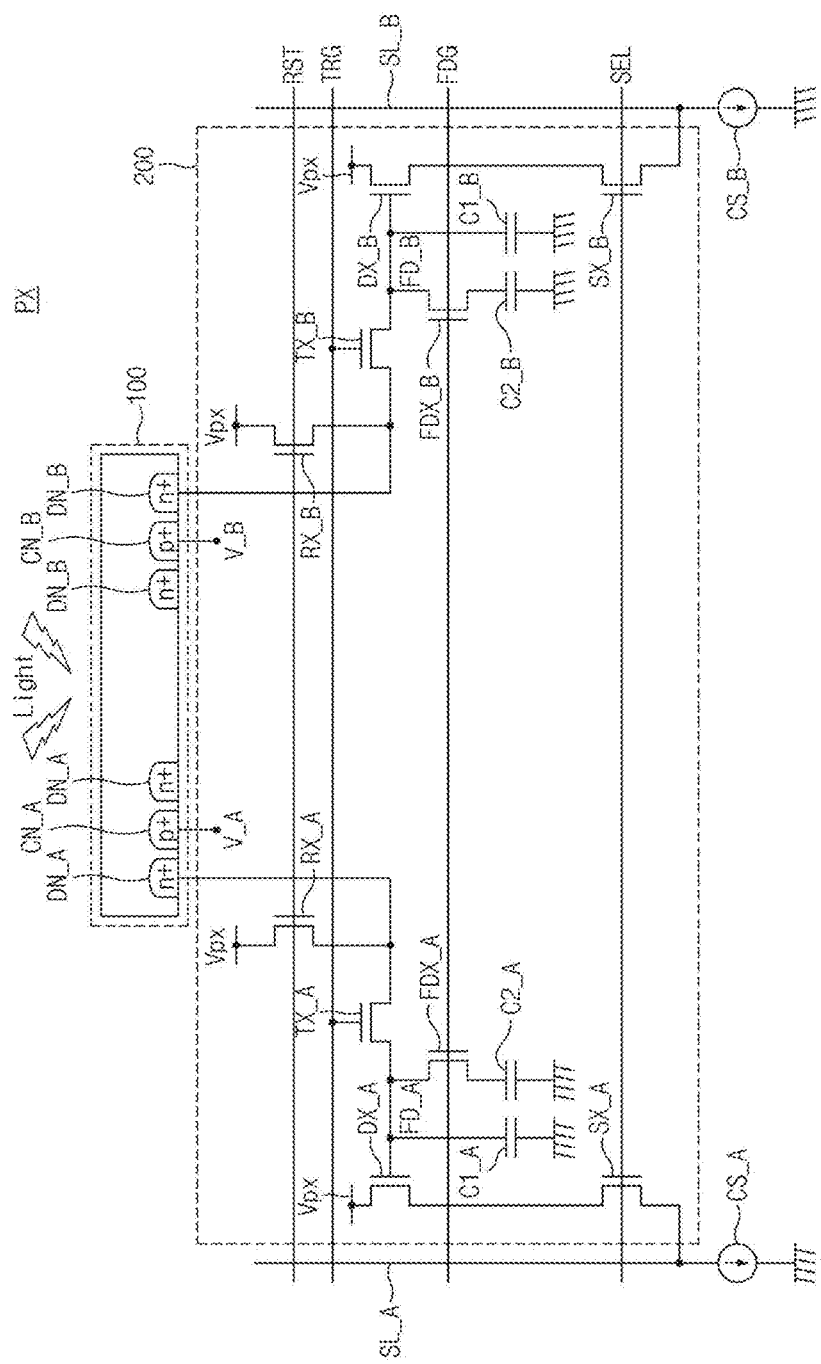
FIG. 2 is a schematic diagram illustrating an example of a pixel included in a pixel array shown in FIG. 1 based on some implementations of the disclosed technology.

FIG. 2 is a schematic diagram illustrating an example of a pixel (PX) included in the pixel array 30 shown in FIG. 1 based on some implementations of the disclosed technology.

Referring to FIG. 2, a pixel (PX) may include a photoelectric conversion region 100 for converting received photons of incident light into electrical signals of the pixel PX and a circuit region 200 for processing the electrical signals to generate a pixel output for the pixel PX.

The photoelectric conversion region 100 may include a first detection node DN_A, a first control node CN_A for the first detection node DN_A, a second detection node DN_B, and a second control node CN_B for the second detection node DN_B. The first control node CN_A and the first detection node DN_A may construct a first demodulation node (or a first tap), and the second control node CN_B and the second detection node DN_B may construct a second demodulation node (or a second tap).

The first detection node DN_A may be arranged to surround the first control node CN_A, and the second detection node DN_B may be arranged to surround the second control node CN_B. The first and second detection nodes DN_A and DN_B may be structured to more easily capture signal carriers that are moving along an electric current (e.g., a hole current in the illustrated example with p and n doping arrangement) formed by the presence of the first and second control nodes CN_A and CN_B.

The first and second control nodes CN_A and CN_B and the first and second detection nodes DN_A and DN_B may be formed in or supported by the substrate by proper p or n dopings. For example, in some implementations, the substrate may be a P-type semiconductor substrate, each of the first and second control nodes CN_A and CN_B may be a P-type impurity region, and each of the first and second detection nodes DN_A and DN_B may be an N-type impurity region. The first control node CN_A and the second control node CN_B may be physically separated from each other, and the first detection node DN_A and the second detection node DN_B may be physically separated from each other. In addition, the first and second control nodes CN_A and CN_B may also be separated from the first and second detection nodes DN_A and DN_B.

The first control node CN_A may receive the first demodulation control signal V_A from the control circuit 41, and the second control node CN_B may receive the second demodulation control signal V_B from the control circuit 41. Difference in potential between the first demodulation control signal V_A and the second demodulation control signal V_B may generate an electric field (or an electric current) that controls flow of signal carriers generated in the substrate by incident light.

Each of the first and second control nodes CN_A and CN_B may capture signal carriers, and may accumulate the captured signal carriers therein.

The operation for capturing photocharges included in the photoelectric conversion region 100 may be carried out throughout sequential time periods including first and second periods as further explained below.

In the first period, the substrate may receive incident light at each photoelectric conversion region 100, and may perform photoelectric conversion of the incident light. The incident light may be processed by such photoelectric conversion, such that a pair of an electron and a hole may occur in the substrate according to the amount of incident light (i.e., intensity of incident light). In this case, the control circuit 41 may transmit the first demodulation control signal V_A to the first control node CN_A, and may transmit the second demodulation control signal V_B to the second control node CN_B. In this case, the first demodulation control signal V_A may be higher in voltage than the second demodulation control signal V_B. For example, the voltage of the first demodulation control signal V_A may be 1.2 V, and the voltage of the second demodulation control signal V_B may be zero volts (0V).

The generation of electrons and holes at each photoelectric conversion region 100 creates an electric field between the first control node CN_A and the second control node CN_B due to a difference in voltage between the first demodulation control signal V_A and the second demodulation control signal V_B, and a current may flow from the first control node CN_A to the second control node CN_B. Thus, in the p and n dopant arrangement shown in FIG. 2, holes in the substrate may move toward the second control node CN_B, and electrons included in the substrate may move toward the first control node CN_A. This movement of holes and electrons forms the electric current and the associated electric field.

Electrons and holes may be generated in the substrate in response to the amount of incident light, and the generated electrons may move toward the first control node CN_A, such that the electrons may be captured by the first detection node DN_A contiguous to or adjacent to the first control node CN_A. Therefore, electrons in the substrate may be used as signal carriers for detecting the amount of incident light.

In the second period that proceeds after the first period, the substrate may receive incident light and photoelectric conversion of the incident light can occur. The photoelectric conversion may be performed in response to the incident light and a pair of an electron and a hole is generated in the substrate according to the amount of incident light (e.g., intensity of incident light). In this case, the control circuit 41 may transmit the first demodulation control signal V_A to the first control node CN_A, and may transmit the second demodulation control signal V_B to the second control node CN_B. In this case, the first demodulation control signal V_A may be lower in voltage than the second demodulation control signal V_B. For example, the voltage of the first demodulation control signal V_A may be zero volts (0V), and the voltage of the second demodulation control signal V_B may be set to 1.2 V.

The generation of electrons and holes at each photoelectric conversion region 100 creates an electric field between the first control node CN_A and the second control node CN_B due to a difference in voltage between the first demodulation control signal V_A and the second demodulation control signal V_B, and a current may flow from the second control node CN_B to the first control node CN_A. Thus, in the p and n dopant arrangement shown in FIG. 2, holes included in the substrate may move toward the first control node CN_A, and electrons included in the substrate may move toward the second control node CN_B.

Electrons may be generated in the substrate in response to the amount of incident light, and the generated electrons may move toward the second control node CN_B, such that the electrons may be captured by the second detection node DN_B contiguous to or adjacent to the second control node CN_B. Therefore, electrons included in the substrate may be used as signal carriers for detecting the amount of incident light.

The circuit region 200 may be located adjacent to the photoelectric conversion region 100 and may be electrically coupled to the first and second detection nodes DN_A and DN_B to receive and process the signals therefrom. The circuit region 200 may include a plurality of elements for processing signals or photocharges captured by the first and second detection nodes DN_A and DN_B and converting the photocharges into an electrical signal for the pixel PX. Control signals RST, TRG, FDG, and SEL that are applied to the plurality of elements may be supplied from the control circuit 410. In some implementations, a pixel voltage (Vpx) may be a power-supply voltage (VDD) or a source voltage (VSS).

Elements for processing photocharges captured by the first detection node DN_A will hereinafter be described with reference to the attached drawings. The circuit region 200 may include a reset transistor RX_A, a transfer transistor TX_A, a first capacitor C1_A, a second capacitor C2_A, a floating diffusion (FD) transistor FDX_A, a drive transistor DX_A, and a selection transistor SX_A.

The reset transistor RX_A may be activated to enter an active state in response to a logic high level of the reset signal RST supplied to a gate electrode thereof, such that potential of the floating diffusion node FD_A and potential of the first detection node DN_A may be reset to a predetermined level (e.g., the pixel voltage Vpx). In addition, when the reset transistor RX_A is activated (i.e., active state), the transfer transistor TX_A can also be activated (i.e., active state) to reset the floating diffusion node FD_A.

The transfer transistor TX_A may be activated (i.e., active state) in response to a logic high level of the transfer signal TRG supplied to a gate electrode thereof, such that charges accumulated in the first detection node DN_A can be transmitted to the floating diffusion node FD_A.

The first capacitor C1_A may be coupled to the floating diffusion node FD_A, such that the first capacitor C1_A can provide predefined electrostatic capacity.

The second capacitor C2_A may be selectively coupled to the floating diffusion node FD_A according to operations of the floating diffusion (FD) transistor FDX_A, such that the second capacitor C2_A can provide additional predefined electrostatic capacity.

Each of the first capacitor C1_A and the second capacitor C2_A may include, for example, at least one of a Metal-Insulator-Metal (MIM) capacitor, a Metal-Oxide-Metal (MOM) capacitor, a Metal-Oxide-Semiconductor (MOS) capacitor, or a junction capacitor.

The floating diffusion (FD) transistor FDX_A may be activated (i.e., active state) in response to a logic high level of the floating diffusion (FD) signal FDG supplied to a gate electrode thereof, such that the floating diffusion (FD) transistor FDX_A may couple the second capacitor C2_A to the floating diffusion node FD_A.

For example, when the amount of incident light is sufficient to correspond to a relatively high illuminance condition, the control circuit 41 may activate the floating diffusion (FD) transistor FDX_A, such that the floating diffusion (FD) transistor FDX_A enters the active state and the floating diffusion node FD_A can be coupled to the second capacitor C2_A. As a result, when the amount of incident light is sufficient to correspond to a high illuminance level, the floating diffusion node FD_A can accumulate much more photocharges therein, which makes it possible to guarantee a high dynamic range.

On the other hand, when the amount of incident light is not sufficient and thus corresponds to a relatively low illuminance level, the control circuit 41 may control the floating diffusion (FD) transistor FDX_A to be deactivated (i.e., inactive state), such that the floating diffusion node FD_A can be isolated from the second capacitor C2_A.

In some other implementations, the floating diffusion (FD) transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A, such that a load (MOS) and a source follower circuit of a constant current source circuit CS_A coupled to one end of the vertical signal line SL_A can be constructed. Thus, the drive transistor DX_A may output a current corresponding to potential of the floating diffusion node FD_A coupled to a gate electrode to the vertical signal line SL_A through the selection transistor SX_A.

The selection transistor SX_A may be activated (i.e., active state) in response to a logic high level of the selection signal SEL supplied to a gate electrode thereof, such that the pixel signal generated from the drive transistor DX_A can be output to the vertical signal line SL_A.

In order to process photocharges captured by the second detection node DN_B, the circuit region 200 may include a reset transistor RX_B, a transfer transistor TX_B, a first capacitor C1_B, a second capacitor C2_B, a floating diffusion (FD) transistor FDX_B, a drive transistor DX_B, and a selection transistor SX_B. Whereas the elements for processing photocharges captured by the second detection node DN_B may operate at different timings from those of other elements for processing photocharges captured by the first detection node DN_A, the elements for processing photocharges captured by the second detection node DN_B may be substantially identical in terms of structures and operations to the other elements for processing photocharges captured by the first detection node DN_A. Thus, detailed descriptions of the operations and structures will be omitted here.

The pixel signal transferred from the circuit region 200 to the vertical signal line SL_A and the pixel signal transferred from the circuit region 200 to the vertical signal line SL_B may be performed by noise cancellation and analog-to-digital (ADC) processing, such that each of the pixel signals can be converted into image data.

Although each of the reset signal RST, the transmission signal TRG, the floating diffusion (FD) signal FDG, and the selection signal SEL shown in FIG. 2 is denoted by a single signal line, each of the reset signal RST, the transmission signal TRG, the floating diffusion (FD) signal FDG, and the selection signal SEL can be supplied through a plurality of signal lines (e.g., two signal lines). In this case, elements for processing photocharges captured by the first detection node DN_A and the other elements for processing photocharges captured by the second detection node DN_B can operate at different timings based on signals supplied through the plurality of signal lines.

The image processor (not shown) may obtain image data from the first period and other image data from the second period, calculate a phase difference using the calculated image data, calculate depth information indicating the distance to the target object 1 based on a phase difference corresponding to each pixel, and generate a depth image including depth information corresponding to each pixel.

Figure 3:
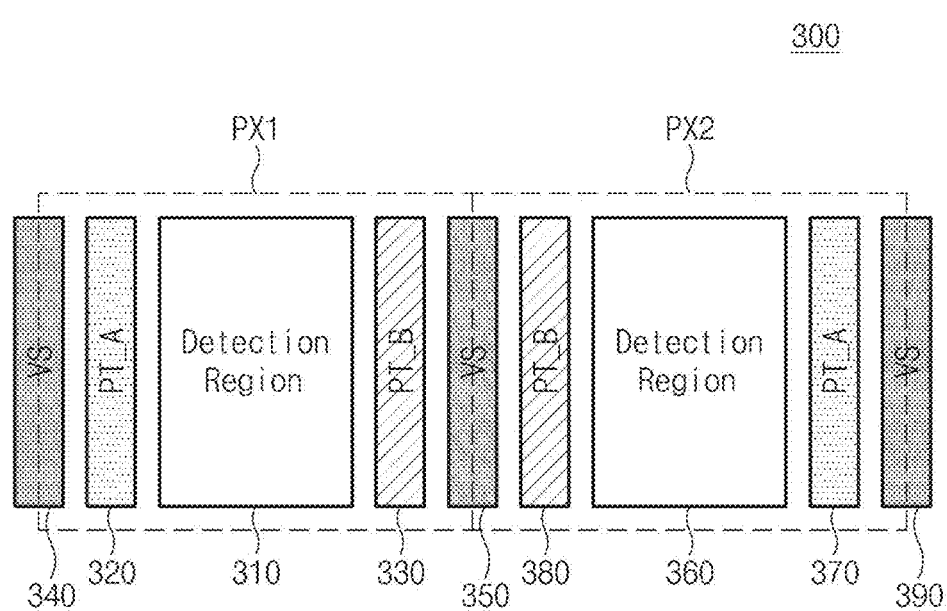
FIG. 3 is a block diagram illustrating an example of a layout structure of the pixel array shown in FIG. 1 based on some implementations of the disclosed technology.

FIG. 3 is a block diagram illustrating an example of a layout structure 300 of the pixel array 30 shown in FIG. 1 based on some implementations of the disclosed technology.

Referring to FIG. 3, the layout structure 300 of the pixel array may include different pixels arranged in an array such as pixels PX1 and PX2 of the pixel array 30 shown in FIG. 1. The remaining pixels of the pixel array 30 can be implemented to have substantially the same layout structures. The regions 310 to 390 illustrated in the layout structure 300 may be formed in or on the substrate.

The first pixel PX1 may include a detection region (i.e., detector) 310, a first pixel transistor region (PT_A) 320, a second pixel transistor region (PT_B) 330, a first line region (VS) 340, and a second line region (VS) 350. In this case, the abbreviation "VS" denotes that a region for voltage stabilization ("VS") is included in the first or second line region 340 or 350.

The detection region (i.e., detector) 310 may be disposed at or near a center part of the first pixel PX1, and may include a first demodulation node and a second demodulation node.

The first pixel transistor region 320, marked as "PT_A", may be disposed at one side (e.g., left side) of the detection region (i.e., detector) 310, and may be elongated along one side of the detection region (i.e., detector) 310. In addition, the first pixel transistor region 320 may include transistors for processing photocharges captured by the first detection node DN_A.

The second pixel transistor region 330 may be disposed at the other side (e.g., right side) of the detection region (i.e., detector) 310, and may be elongated along the other side of the detection region (i.e., detector) 310. The first pixel transistor region 320 and the second pixel transistor region 330 may be disposed at opposite sides of the detection region 310. In addition, the second pixel transistor region 330 may include transistors for processing photocharges captured by the second detection node DN_B.

The first line region 340 may be disposed between the second pixel transistor region of the pixel (which is not shown) located at the left side of the first pixel PX1 and the first pixel transistor region 320 of the first pixel PX1, and may be elongated along one side of the first pixel transistor region 320. The first line region 340 may include a voltage stabilization (VS) region for fixing a voltage of a P-well region disposed below the pixel transistor of the first pixel PX1 and the pixel located at the left side of the first pixel PX1.

The second line region 350 may be disposed between the second pixel transistor region 330 of the first pixel PX1 and the first pixel transistor region 370 of the second pixel PX2, and may be elongated along one side of the second pixel transistor region 330. The second line region 350 may include a voltage stabilization (VS) region for fixing a voltage of a P-well region disposed below the pixel transistor of the first pixel PX1 and the second pixel PX2.

Each of the first line region 340, the second line region 350, and the third line region 390 may be arranged around or along a boundary between contiguous pixels.

Referring to FIG. 3, at least some parts of the second line region 350 may be included in the first pixel PX1, and at least some other parts of the second line region 350 may be included in the second pixel PX2. Similarly, other line regions 340 and 390 may also be arranged over two contiguous pixels.

The second pixel PX2 may include a detection region (i.e., detector) 360, a first pixel transistor region (PT_A) 370, a second pixel transistor region (PT_B) 380, a second line region (VS) 350, and a third line region (VS) 390. In the second pixel PX2, unlike the first pixel PX1, the first pixel transistor region 370 and the second pixel transistor region 380 may be respectively disposed at the right side and the left side with respect to the detection region (e.g., detector) 360. Other than this, arrangement shapes, structures, and functions of the elements in the second pixel PX2 may correspond to those of the corresponding elements included in the first pixel PX1. Such redundant description thereof will herein be omitted for brevity.

Referring to FIG. 3, in each of the pixels PX1 and PX2, the first pixel transistor region for processing photocharges captured by the first detection node DN_A and the second pixel transistor region for processing photocharges captured by the second detection node DN_B may be isolated from each other, such that the first pixel transistor region and the second pixel transistor region may be respectively disposed at the left side and the right side with respect to the detection region (e.g., detector). In some other implementations, the first pixel transistor region and the second pixel transistor region may be respectively disposed at an upper side and a lower side with respect to the detection region (e.g., detector) 310.

Figure 4:
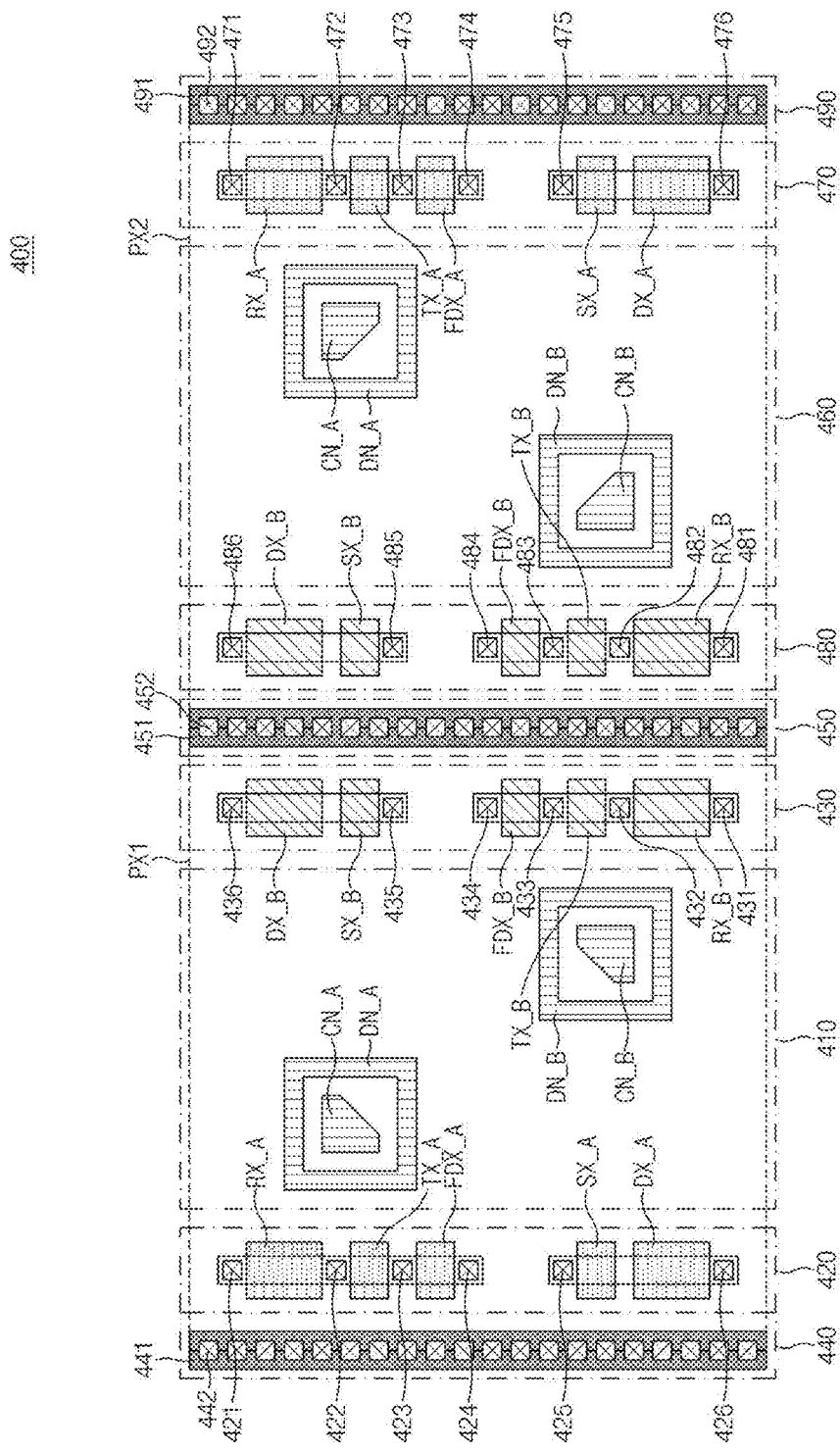
FIG. 4 is a schematic diagram illustrating an example of a layout structure of the pixel array shown in FIG. 3 based on some implementations of the disclosed technology.

FIG. 4 is a schematic diagram illustrating an example of a layout structure of the pixel array shown in FIG. 3 based on some implementations of the disclosed technology.

Referring to FIG. 4, the first pixel PX1 and the second pixel PX2 included in the layout structure 400 may respectively correspond to the first pixel PX1 and the second pixel PX2 shown in FIG. 3. The following constituent elements 410, 420, 430, 440, 450, 460, 470, 480, and 490 shown in FIG. 4 may respectively correspond to the constituent elements 310, 320, 330, 340, 350, 360, 370, 380, and 390 shown in FIG. 3.

The detection region (e.g., detector) 410 may include a first control node CN_A, a first detection node DN_A, a second control node CN_B, and a second detection node DN_B. For example, FIG. 2 shows the example of the cross-sectional view that the detection region 410 overlaps with the photoelectric conversion region 100.

The first demodulation node comprising the first control node CN_A and the first detection node DN_A and the second demodulation node comprising the second control node CN_B and the second detection node DN_B may be arranged along a diagonal line (or in a diagonal direction) having a predetermined angle with respect to one side (e.g., left side or upper side) of the detection region (e.g., detector) 410 within the detection region (e.g., detector) 410. Although FIG. 4 illustrates that the first demodulation node is disposed at an upper left end of the detection region (e.g., detector) 410 and the second demodulation node is disposed at a lower right end of the detection region (e.g., detector) 410 for convenience of description, the disclosed technology is not limited thereto, and other implementations are also possible. For example, in some implementations the first demodulation node can be disposed at a lower left end of the detection region (e.g., detector) 410 and the second demodulation node can be disposed at an upper right end of the detection region (i.e., detector) 410. In some other implementations, the first demodulation node and the second demodulation node may also be arranged in a line in a horizontal direction or a vertical direction.

The first control node CN_A may be formed in a polygonal shape including a first side facing the second control node CN_B. The first side facing the second control node CN_B is longer in length than a second side not facing the second control node CN_B. In the implementation as shown in FIG. 4, the first control node CN_A has the first side that forms an angle between 0 to 90 degrees with respect to horizontal or vertical line and the second sides that are parallel or perpendicular to the horizontal or vertical line. Likewise, the second control node CN_B may be formed in a polygonal shape in which the first side facing the first control node CN_A is longer in length than the second side not facing the first control node CN_A. In some implementations, differently from FIG. 4, each of the first control node CN_A and the second control node CN_B may be formed in a trapezoidal or triangular shape.

In some implementations, the first control node CN_A and the second control node CN_B of the same pixel PX1 may be obliquely arranged in a manner that the first side of the first control node CN_A is arranged to face or opposite to the first side of the second control node CN_B. In this case, the above-mentioned oblique arrangement of the first control node CN_A and the second control node CN_B may indicate that the first side of each of the first control node CN_A and the second control node CN_B is not parallel to a side (e.g., upper side or lower side) of the first pixel PX1 and is rotated by a predetermined angle from the side of the first pixel PX1.

The control nodes CN_A and CN_B receive different voltages and the hole current flowing between the control nodes may increase in proportion to the the potential differences between control nodes and increase in inverse proportion to the distance between the control nodes. The hole current flowing between the control nodes may increase in proportion to the increasing length of the facing sides of the control nodes. Thus, the hole current may be decided based on potential differences between control nodes and a resistance between the control nodes. The longer the distance between the control nodes, the higher the resistance between the control nodes. In addition, the shorter the facing sides of the control nodes, the higher the resistance between the control nodes. In the following description, it is assumed that potential differences among the control nodes receiving different voltages are identical to each other.

In the diagonal layout structure shown in FIG. 4, the distance between the first control node CN_A and the second control node CN_B may increase, which results in the increase of the resistance. As a result, a hole current flowing between the first control node CN_A and the second control node CN_B may be reduced so that power consumption needed to drive the pixel array 30 may be reduced.

When there is another control node that is located to correspond to the second control node CN_B of the first pixel PX1 to generate hole currents, the magnitude of hole currents may be determined based on distances between the second control node CN_B and another control node and length of facing sides of the second control node CN_B and another control node. Referring to FIG. 4, a hole current flowing between the second control node CN_B of the first pixel PX1 and the first control node CN_A of the first pixel PX1 may be relatively strong since the distance between the second control node CN_B of the first pixel PX1 and the first control node CN_A of the first pixel PX1 is relatively short and the facing sides of the first and second control nodes CN_A and CN_B are relatively long in length.

As compared to the hole current between the second control node CN_B of the first pixel PX1 and the first control node CN_A of the first pixel PX1, the hole current flowing between the second control node CN_B of the first pixel PX1 and the first control nodes CN_A of the second pixel PX2 may be relatively week. This is because that the distance between the second control node CN_B of the first pixel PX1 and the first control nodes CN_A of the second pixel PX2 is relatively long and the facing sides of the second control node CN_B of the first pixel PX1 and the first control node CN_A of the second pixel PX2 are relatively short in length. As a result, crosstalk between the contiguous pixels may be reduced, and unnecessary power consumption may also be reduced.

Figure 6:
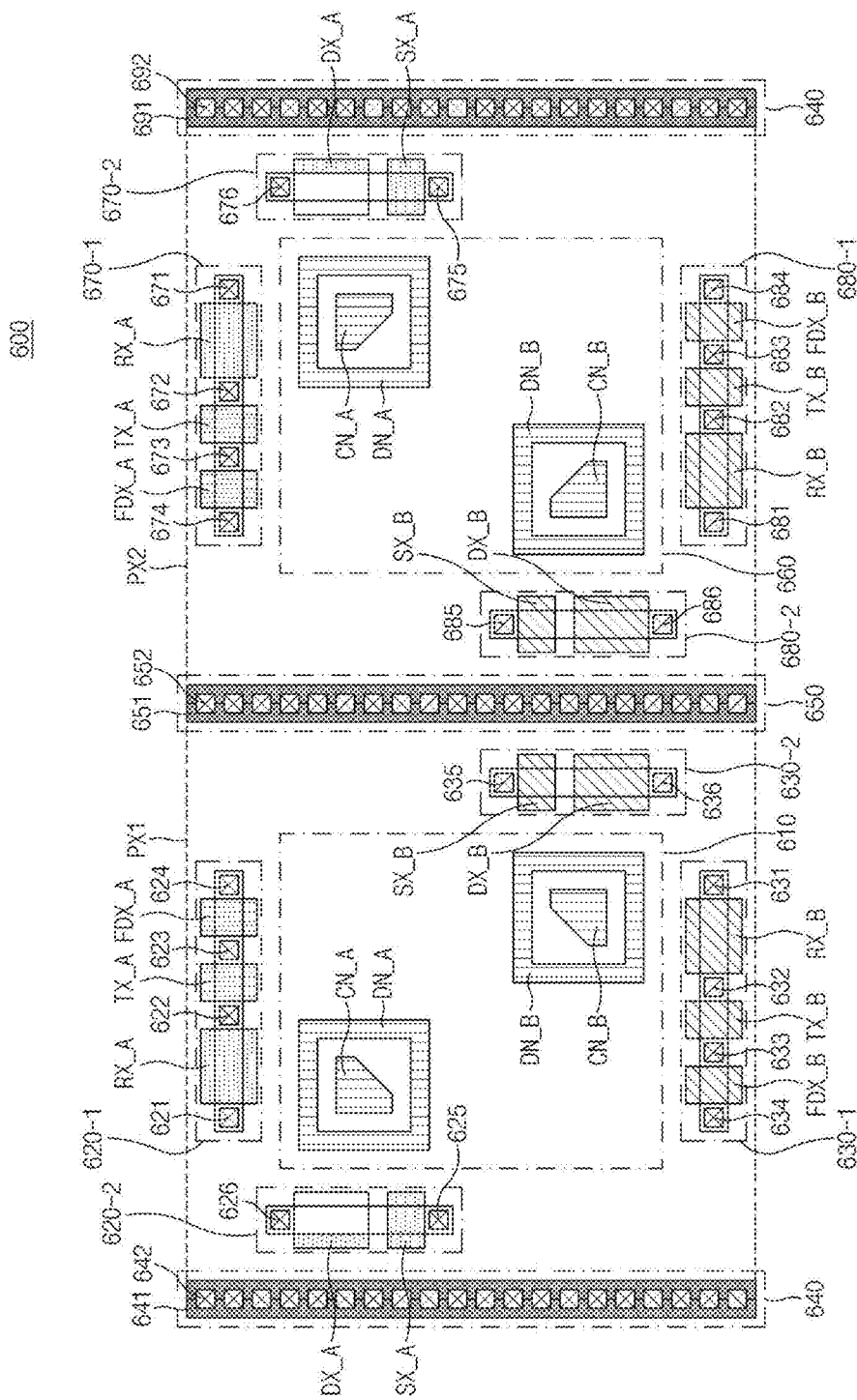
FIG. 6 is a schematic diagram illustrating another example of a layout structure of the pixel array shown in FIG. 5 based on some implementations of the disclosed technology.
Figure 8:
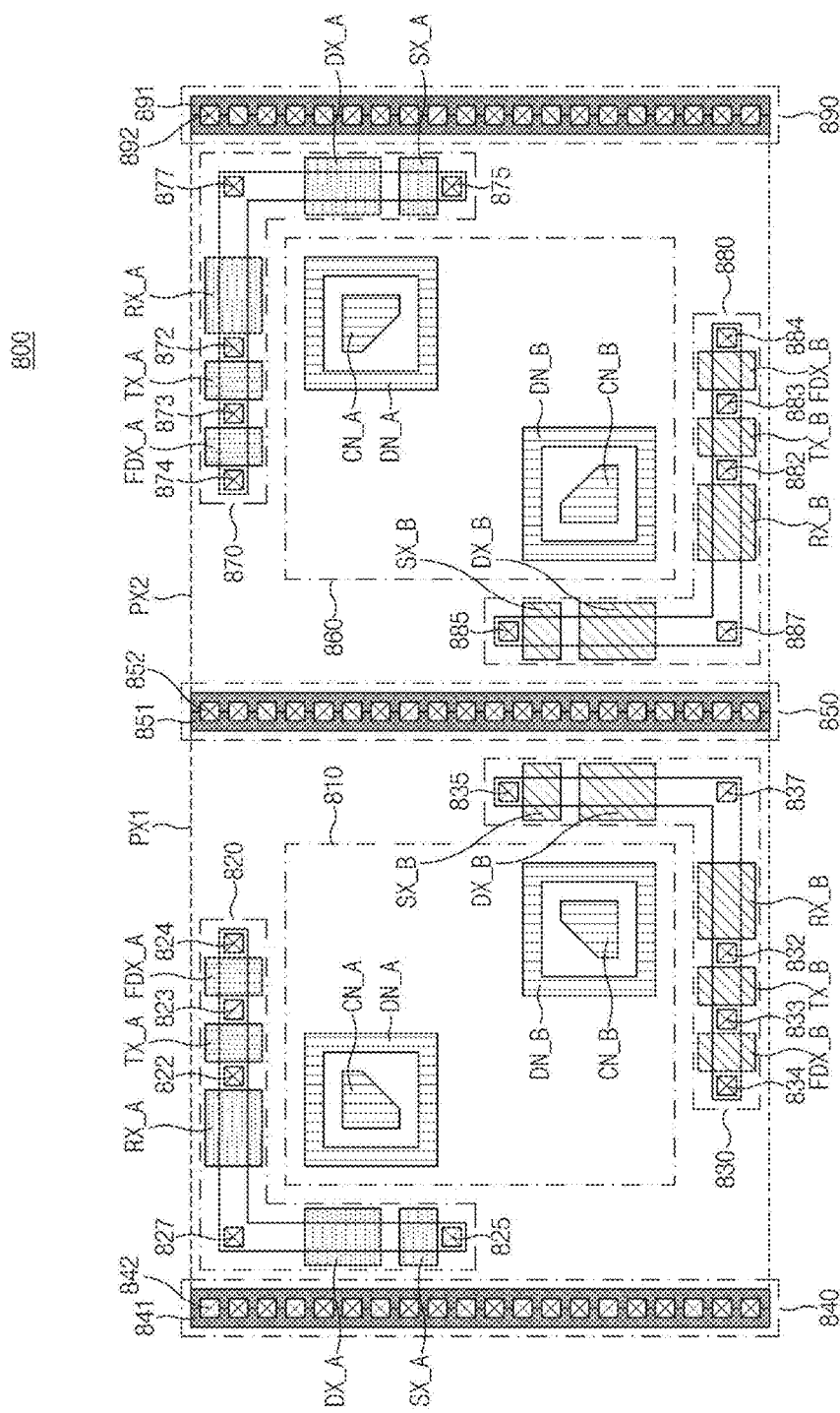
FIG. 8 is a schematic diagram illustrating another example of a layout structure of the pixel array shown in FIG. 5 based on some implementations of the disclosed technology.

Referring to FIGS. 4, 6, and 8, transistors may be configured such that a gate insulation layer and a gate electrode that are disposed over the substrate may construct a gate, impurity regions disposed at both sides of the gate electrode in the substrate may respectively construct a source and a drain, and a lower region of the gate electrode in the substrate may construct a channel region. In addition, the source and the drain may be surrounded by a P-well region doped with P-type impurities at a predefined density, and the P-well region may extend to a lower region of the gate electrode such that the extended P-well region is disposed in the lower region of the gate electrode. The P-well region may extend to a lower portion of the voltage stabilization (VS) region, such that the P-well region may be in contact with and surround the voltage stabilization (VS) region. The P-well region surrounding the voltage stabilization (VS) region may extend to a lower region of the contiguous pixel transistor. For convenience of description and better understanding of the disclosed technology, gates of the respective transistors may be denoted by reference numbers indicating the corresponding transistors. For example, the gate of the reset transistor of the first pixel transistor region 420 may be denoted by a reference number (RX_A) indicating the reset transistor. In addition, terminals (e.g., 421, 422, etc.) to be coupled to an external part (e.g., the first detection node DN_A, etc.) may be located at one end (i.e., a source or a drain) of each transistor.

The first pixel transistor region 420 may include a plurality of transistors configured to convert photocharges detected by the first demodulation node into an electrical signal. In some implementations, the first pixel transistor region 420 may include a reset transistor RX_A, a transfer transistor TX_A, a floating diffusion (FD) transistor FDX_A, a selection transistor SX_A, and a drive transistor DX_A. In this case, the reset transistor RX_A, the transfer transistor TX_A, and the floating diffusion (FD) transistor FDX_A may be coupled in series to one another, and the serially-coupled structure may be called a first transistor group. In addition, the selection transistor SX_A and the drive transistor DX_A may be coupled in series to each other, and the serially-coupled structure may be called a second transistor group. The first transistor group and the second transistor group may be spaced apart from each other by a predetermined distance. The first transistor group may be disposed in an upper part of the first pixel transistor region 420, and the second transistor group may be disposed in a lower part of the first pixel transistor region 420. Although it is assumed that the first transistor group includes the reset transistors RX_A and RX_B, the transfer transistors TX_A and TX_B, and the floating diffusion (FD) transistors FDX_A and FDX_B, other implementations are also possible. For example, in some other implementations, the first transistor group may not include the floating diffusion (FD) transistors FDX_A and FDX_B, such that the floating diffusion (FD) transistors FDX_A and FDX_B may herein be omitted from the first transistor group as necessary. In this case, the second capacitors C2_A and C2_B shown in FIG. 2 may be omitted from the first transistor group.

The first terminal 421 coupled to the drain of the reset transistor RX_A may receive a ground voltage as an input. In some implementations, the ground voltage may be supplied from a metal line region formed over the substrate. In this case, the metal line region may include a signal line for supplying a voltage needed to operate each pixel, a signal line for transferring an output signal of each pixel, a connection line for interconnecting the internal constituent elements of each pixel, and the like. A second terminal 422 coupled to the source of the reset transistor RX_A and the source of the transfer transistor TX_A may be coupled to the first detection node DN_A.

A third terminal 423 coupled to the drain of the transfer transistor TX_A and the source of the floating diffusion (FD) transistor FDX_A may be coupled to the first capacitor C1_A (see FIG. 2) and the gate of the drive transistor DX_A. In some implementations, the third terminal 423 may refer to the floating diffusion node.

A fourth terminal 424 coupled to the drain of the floating diffusion (FD) transistor FDX_A may be coupled to the second capacitor C2_A (see FIG. 2).

A fifth terminal 425 coupled to the source of the selection transistor SX_A may be coupled to the vertical signal line SL_A (see FIG. 2).

A sixth terminal 426 coupled to the drain of the drive transistor DX_A may receive the pixel voltage (Vpx).

The second pixel transistor region 430 may include a plurality of transistors configured to convert photocharges detected by the second demodulation node into an electrical signal. In some implementations, the second pixel transistor region 430 may include a reset transistor RX_B, a transfer transistor TX_B, a floating diffusion (FD) transistor FDX_B, a selection transistor SX_B, and a drive transistor DX_B. In this case, the reset transistor RX_B, the transfer transistor TX_B, and the floating diffusion (FD) transistor FDX_B may be coupled in series to one another, and the serially-coupled structure may be called a first transistor group. In addition, the selection transistor SX_B and the drive transistor DX_B may be coupled in series to each other, and the serially-coupled structure may be called a second transistor group. The first transistor group and the second transistor group may be spaced apart from each other by a predetermined distance. The first transistor group may be disposed in a lower part of the second pixel transistor region 430, and the second transistor group may be disposed in an upper part of the second pixel transistor region 430. The arrangements of the transistors included in the first transistor group and the second transistor group of first pixel transistor region 420 may be inversely different from those in the first transistor group and the second transistor group of the second pixel transistor region 430. For example, the reset transistor RX_A, the transfer transistor TX_A, the floating diffusion (FD) transistor FDX_A, the selection transistor SX_A, and the drive transistor DX_A may be sequentially arranged in a downward direction of the first pixel transistor region 420. The drive transistor DX_B, the selection transistor SX_B, the floating diffusion (FD) transistor FDX_B, the transfer transistor TX_B, and the reset transistor RX_B may be sequentially arranged in a downward direction of the second pixel transistor region 430. Therefore, the first demodulation nodes CN_A and DN_A, the first pixel transistor region 420, the second demodulation nodes CN_B and DN_B, and the second pixel transistor region 430 may be arranged symmetrical to one another with respect to the center of the detection region (e.g., detector) 410. If rotated by a predetermined angle of 180° with respect to the center of the detection region (e.g., detector) 410, the first demodulation nodes CN_A and DN_A may be relocated in the positions corresponding to the second demodulation nodes CN_B and DN_B. If rotated by a predetermined angle of 180° with respect to the center of the detection region (e.g., detector) 410, the first pixel transistor region 420 may be relocated in the position corresponding to the second pixel transistor region 430. Due to such symmetrical arrangement, resistance components (e.g., the length of a metal line, parasitic capacitance, etc.) that exist between the first pixel transistor region 420 and the first demodulation nodes CN_A and DN_A may be identical to resistance components that exist between the second pixel transistor region 430 and the second demodulation nodes CN_B and DN_B. Thus, noise components included in the pixel signal of the first pixel transistor region 420 are substantially identical to noise components included in the pixel signal of the second pixel transistor region 430, such that such noise components can be easily removed or cancelled by the image processor (not shown) or others.

A first terminal 431 coupled to the drain of the reset transistor RX_B may receive the pixel voltage (Vpx) from the metal line region. The second terminal 432 coupled to the source of the reset transistor RX_B and the source of the transfer transistor TX_B may be coupled to the second detection node DN_B.

A third terminal 433 coupled to the drain of the transfer transistor TX_B and the source of the floating diffusion (FD) transistor FDX_B may be coupled to the first capacitor C1_B (see FIG. 2) and the gate of the drive transistor DX_B. In some implementations, the third terminal 433 may refer to the floating diffusion node.

A fourth terminal 434 coupled to the drain of the floating diffusion (FD) transistor FDX_B may be coupled to the second capacitor C2_B (see FIG. 2).

A fifth terminal 435 coupled to the source of the selection transistor SX_B may be coupled to the vertical signal line SL_B (see FIG. 2).

A sixth terminal 436 coupled to the drain of the drive transistor DX_B may receive the pixel voltage (Vpx) from the metal line region.

The first line region 440 may include a voltage stabilization (VS) region 441. The voltage stabilization (VS) region 441 may fix a voltage of the P-well region disposed below the first pixel transistor region 420 of the first pixel PX1 and the second pixel transistor region (not shown) of the pixel located at the left side of the first pixel PX1. The voltage stabilization (VS) region 441 may be a P⁺ region formed in the substrate while being doped with impurities having higher density than the P-well region.

The voltage stabilization (VS) region 441 may receive a ground voltage from voltage terminals 442, such that the voltage stabilization (VS) region 441 may enable the voltage of the P-well region contacting the voltage stabilization (VS) region 441 to be fixed to a specific voltage (e.g., a ground voltage). The P-well region may be disposed below the first pixel transistor region 420, and may be disposed below the second pixel transistor region (not shown) of the pixel located at the left side of the first pixel PX1, such that a body of each transistor may be formed and a voltage of the P-well region may affect a threshold voltage of each transistor. The voltage stabilization (VS) region 441 may enable a voltage of the P-well region to be fixed, such that each of the transistors included in the first pixel transistor region 420 and each of the transistors included in the second pixel transistor region (not shown) of the pixel located at the left side of the first pixel PX1 can be stably operated. In some implementations, the voltage stabilization (VS) region 441 may always receive the ground voltage from the voltage terminals 442.

The first line region 440 may include a plurality of voltage terminals 442 configured to provide a ground voltage to the voltage stabilization (VS) region 441. The number and position of the voltage terminals 442 shown in FIG. 4 are merely examples, and the disclosed technology is not limited thereto. In some implementations, the voltage terminals 442 may be coupled to voltage terminals included in other line regions (e.g., line regions located contiguous to the first line region 440 in upper, lower, left, and right sides) contiguous to the first line region 440. Therefore, from the viewpoint of the pixel array 30, the voltage stabilization (VS) regions included in the pixel array 30 may be electrically coupled to one another in a mesh shape. Due to such connection, IR drop (e.g., voltage drop) of the signal line for providing the ground voltage may occur such that the phenomenon in which the ground voltage is abnormally supplied to a specific voltage stabilization (VS) region can be prevented.

The second line region 450 may include a voltage stabilization (VS) region 451. The voltage stabilization (VS) region 451 may fix a voltage of the second pixel transistor region 430 of the first pixel PX1 and a voltage of the P-well region disposed below the second pixel transistor region 480 of the second pixel PX2. The second line region 450 may include a plurality of voltage terminals 452 for providing a ground voltage to the voltage stabilization (VS) region 451. Other than the position and connection relationship of the second line region 450, the second line region 450 may be substantially identical to the first line region 440. Thus, redundant description thereof will herein be omitted for brevity.

The voltage stabilization (VS) region 451 may receive a ground voltage from the voltage terminals 442, and generate a relatively weak hole current in association with the control nodes that are located contiguous or adjacent to the voltage stabilization (VS) region 451. The hole current generated by the voltage stabilization (VS) region 451 may flow between the first pixel PX1 and the second pixel PX2. For example, the relatively week hole current can generate due to the activated second control node CN_B of the first pixel PX1 and the activated second control node CN_B of the second pixel PX2, while the second control nodes CN_B receive the voltage of 1.2 V. This relatively week hole current can help to collect or capture the photocharges in addition to the hole flowing between the first control node CN_A and the second control node CN_B that are included in the same pixel. With the hole current flowing within the same pixel, there have been some limitations to collect or capture the photocharges that are between the second control node CN_B of the first pixel PX1 and the second control node CN_B of the second pixel PX2 (for example, the photocharges at a position located close to each of the second control node CN_B of the first pixel PX1 and the second control node CN_B of the second pixel PX2). Such photocharges can be more easily collected or captured by the additional hole current that is generated due to the activated second control node CN_B of the first pixel PX1 and the second pixel PX2. Thus, with the additional collection using the relatively week hole current between the first pixel PX1 and the second pixel PX2, it is possible to increase the detection sensitivity of the first and second demodulation nodes. Such hole current may be generated by the voltage stabilization (VS) region 451 surrounded by the P-well region, such that the hole current can be sufficiently weak enough not to affect crosstalk between the contiguous pixels through a thickness of the P-well region. In addition, since the distance between the voltage stabilization (VS) region 451 and the second control node CN_B of the first pixel PX1 is identical to the distance between the voltage stabilization (VS) region 451 and the second control node CN_B of the second pixel PX2, the effects of collecting additional photocharges can be equally distributed to the respective pixels, such that erroneous distance calculation can be prevented.

The detection region (e.g., detector) 460 may include a first control node CN_A, a first detection node DN_A, a second control node CN_B, and a second detection node DN_B. The first control node CN_A, the first detection node DN_A, the second control node CN_B, and the second detection node DN_B of the detection region (e.g., detector) 460 are substantially identical in structure and function to the first control node CN_A, the first detection node DN_A, the second control node CN_B, and the second detection node DN_B of the detection region (e.g., detector) 410, and as such redundant description thereof will herein be omitted for convenience of description. The first demodulation nodes CN_A and DN_A and the second demodulation nodes CN_B and DN_B of the detection region (e.g., detector) 460 may be arranged symmetrical to the first demodulation nodes CN_A and DN_A and the second demodulation nodes CN_B and DN_B of the detection region (e.g., detector) 410 with respect to a boundary between the first pixel PX1 and the second pixel PX2.

The signal lines for supplying a demodulation control signal not only to the first control node CN_A and the second control node CN_B of the first pixel PX1, but also to the first control node CN_A and the second control node CN_B of the second pixel PX2 may be elongated in a vertical direction shown in FIG. 4. In this case, for convenience of description, the signal line for supplying a demodulation control signal to the first control node CN_A of the first pixel PX1 will hereinafter be referred to as a first line, the signal line for supplying a demodulation control signal to the second control node CN_B of the first pixel PX1 will hereinafter be referred to as a second line, the signal line for supplying a demodulation control signal to the first control node CN_A of the second pixel PX2 will hereinafter be referred to as a third line, and the signal line for supplying a demodulation control signal to the second control node CN_B of the second pixel PX2 will hereinafter be referred to as a fourth line. In addition, in the direction from the left side to the right side in FIG. 4, it is assumed that the first control node CN_A and the second control node CN_B of the first pixel PX1 and the first control node CN_A and the second control node CN_B of the second pixel PX2 are sequentially arranged unlike FIG. 4, and the first to fourth lines are then sequentially arranged. In this case, the same voltage (e.g., 1.2V) may be applied to the first line and the third line, the same voltage (e.g., 0V) may be applied to the second line and the fourth line. Here, waveforms (e.g., rising time, falling time, or slope) of the demodulation control signal may be modified by parasitic capacitance between the contiguous signal lines (e.g., the first and second lines, the second and third lines, the third and fourth lines, etc.) receiving different voltages, such that pixel characteristics (e.g., demodulation contrast) may be deteriorated.

However, in a situation in which the first control node CN_A and the second control node CN_B of the first pixel PX1 and the second control node CN_B and the first control node CN_A of the second pixel PX2 are sequentially arranged as shown in FIG. 4, it is possible to prevent the waveform deformation of the demodulation control by arranging the second line and the fourth line that receive the same voltage contiguous or adjacent to each other. In some implementations, the second line and the fourth line formed to receive the same voltage may be integrated into one line, and the integrated line may be arranged along a boundary between the first pixel PX1 and the second pixel PX2 in the metal line region. In this case, the number of lines can be reduced by half, and each integrated line can secure a width that is two times larger as compared to the case that the second line and the fourth line are formed separately from each other. By having the sufficient width of the integrated line, it is possible to prevent the deformation of the demodulation control signal, which is caused by IR drop. In addition, the distance between the contiguous or adjacent lines receiving different voltages can be increased by two times, such that parasitic capacitance can be significantly reduced.

The arrangement and connection relationship of the transistors RX_A, TX_A, FDX_A, SX_A, and DX_A included in the second pixel transistor region 480 of the second pixel PX2 may be substantially identical to those of the transistors RX_B, TX_B, FDX_B, SX_B, and DX_B included in the second pixel transistor region 430 of the first pixel PX1. In this case, the connection relationship may refer to the connection relationship between the external terminal (e.g., a detection node or a power-supply terminal) and the terminal (e.g., a gate, a source, or a drain) of each transistor.

The arrangement and connection relationship of the transistors RX_B, TX_B, FDX_B, SX_B, and DX_B included in the second pixel transistor region 470 of the second pixel PX2 may be substantially identical to those of the transistors RX_A, TX_A, FDX_A, SX_A, and DX_A included in the first pixel transistor region 420 of the first pixel PX1. Reference signs 481 to 486 and 471 to 476 in FIG. 4 are indicated to terminals corresponding to the terminals of the first pixel PX1, respectively.

The third line region 490 may include a voltage stabilization (VS) region 491. The voltage stabilization (VS) region 491 may fix a voltage of the first pixel transistor region 470 of the second pixel PX2, and a voltage of the P-well region disposed below a first pixel transistor region (not shown) of the pixel disposed at the right side of the second pixel PX2. The third line region 490 may include voltage terminals 492 for supplying a ground voltage to the voltage stabilization (VS) region 491. Other than the position and connection relationship of the third line region 490, the third line region 490 may be substantially identical to the first line region 440, and thus redundant description thereof will herein be omitted for brevity.

Referring to FIG. 4, transistors included in each pixel are distributed to both sides for each demodulation node with respect to the detection region (e.g., detector), such that size reduction of each transistor can be minimized irrespective of size reduction of each pixel, and deterioration of pixel performance can be prevented. For example, when the transistors included in each pixel are linearly disposed at one side of the detection region (e.g., detector), each transistor may be unavoidably reduced in size. In addition, as each pixel is reduced in size, performance of each transistor may be abruptly deteriorated.

In addition, the first demodulation nodes CN_A and DN_A and the first pixel transistor 420 may be arranged symmetrical to the second demodulation nodes CN_B and DN_B and the second pixel transistor 430 with respect to the center point of the detection region (e.g., detector) 410. The first pixel PX1 and the second pixel PX2 may be arranged symmetrical to each other with respect to a boundary between the first pixel PX1 and the second pixel PX2, such that resistance components between the first demodulation node and the first pixel transistor region and resistance components between the second demodulation node and the second pixel transistor region are identical to each other in the overall pixel array 30. As a result, noise components included in the pixel signal of the first pixel transistor region and noise components included in the pixel signal of the second pixel transistor region are substantially identical to each other in the overall pixel array 30, such that such noise components can be easily removed or cancelled by the image processor (not shown) or the like.

Figure 5:
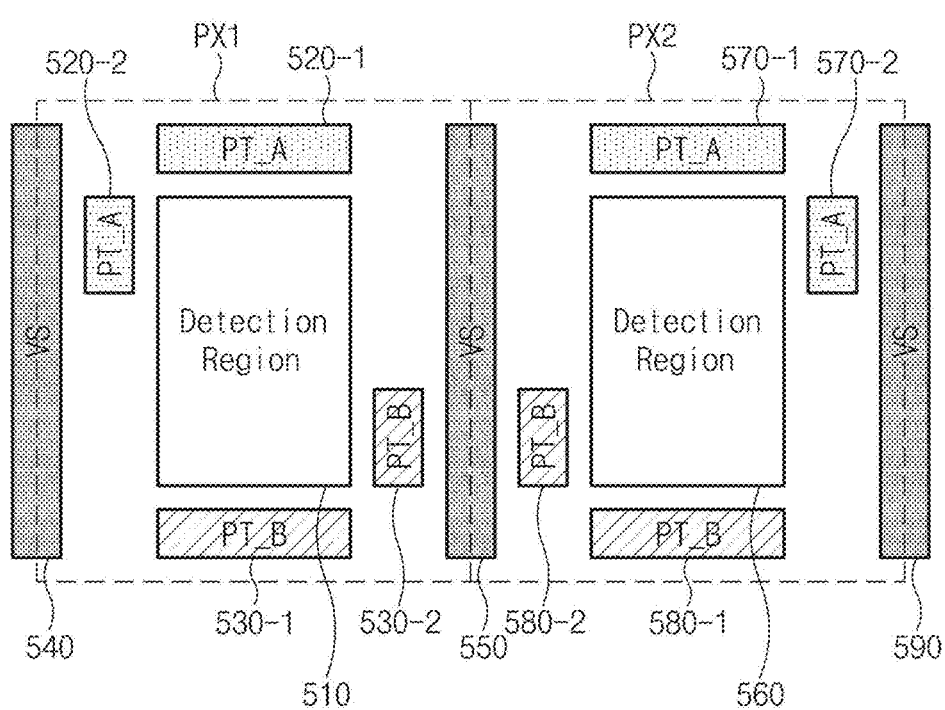
FIG. 5 is a block diagram illustrating another example of a layout structure of the pixel array shown in FIG. 1 based on some implementations of the disclosed technology.

FIG. 5 is a block diagram illustrating another example of a layout structure 500 of the pixel array 30 shown in FIG. 1 based on some implementations of the disclosed technology.

Referring to FIG. 5, the layout structure 500 of the pixel array may include some pixels PX1 and PX2 of the pixel array 30 shown in FIG. 1, and the remaining pixels of the pixel array 30 can be implemented to have substantially the same layout structures.

The first pixel PX1 may include a detection region (e.g., detector) 510, first pixel transistors 520-1 and 520-2, second pixel transistor regions 530-1 and 530-2, a first line region 540, and a second line region 550.

The detection region (e.g., detector) 510 may be disposed around or at the center part of the first pixel PX1, and may include a first demodulation node and a second demodulation node.

The first pixel transistor region 520-1 may be disposed over the detection region (e.g., detector) 510, and may be elongated along an upper side of the detection region (e.g., detector) 510. The first pixel transistor region 520-2 may be disposed at a left side of the detection region (e.g., detector) 510, and may be elongated along a left side of the detection region (e.g., detector) 510. Each of the first pixel transistor regions 520-1 and 520-2 may include a plurality of transistors to process photocharges captured by the first detection node DN_A. Some parts of the transistors may be disposed in the first pixel transistor region 520-1, and the remaining transistors may be disposed in the first pixel transistor region 520-2.

The second pixel transistor region 530-1 may be disposed below the detection region (e.g., detector) 510, and may be elongated along a lower side of the detection region (e.g., detector) 510. The second pixel transistor region 530-2 may be disposed at a right side of the detection region (e.g., detector) 510, and may be elongated along a right side of the detection region (e.g., detector) 510. Each of the second pixel transistor regions 530-1 and 530-2 may include a plurality of transistors to process photocharges captured by the second detection node DN_B. Some parts of the transistors may be disposed in the second pixel transistor region 530-1, and the remaining transistors may be disposed in the second pixel transistor region 530-2.

Although not shown in the drawings, the first line region 540 may be elongated along a boundary between the first pixel PX1 and the pixel disposed at the left side of the first pixel PX1. The first line region 540 may include a voltage stabilization (VS) region. Here, the voltage stabilization (VS) region may fix a voltage of the first pixel PX1 and a voltage of the P-well region disposed below the pixel transistor of the pixel disposed at the left side of the first pixel PX1.

The second line region 550 may be elongated along a boundary between the first pixel PX1 and the second pixel PX2. The second line region 550 may include a voltage stabilization (VS) region for fixing a voltage of the P-well region disposed below the pixel transistor of the first pixel PX1 and the second pixel PX2.

Referring to FIG. 5, at least some parts of the second line region 550 may be contained in the first pixel PX1, and some other parts of the second line region 550 may be contained in the second pixel PX2. Other line regions 540 and 590 may also be arranged over contiguous pixels different from each other.

The second pixel PX2 may include a detection region (e.g., detector) 560, first pixel transistor regions 570-1 and 570-2, second pixel transistor regions 580-1 and 580-2, a second line region 550, and a third line region 590. Arrangement shapes, structures, and functions of the respective constituent elements included in the second pixel PX2 may correspond to arrangement shapes, structures, and functions of the respective constituent elements included in the first pixel PX1, and as such redundant description thereof will herein be omitted for brevity.

Referring to FIG. 5, in each of the first pixel PX1 and the second pixel PX2, the first pixel transistor region for processing photocharges captured by the first detection node DN_1 and the second pixel transistor region for processing photocharges captured by the second detection node DN_B may be isolated from each other in a vertical direction. In addition, the first pixel transistor region may be arranged to surround a single vertex point of the detection region (e.g., detector), and the second pixel transistor region may be arranged to surround another vertex point located in a diagonal direction from the single vertex point. Therefore, when the arrangement structure of demodulation nodes in the detection region (e.g., detector) shown in FIG. 5 is identical to that of FIG. 4, the first demodulation node and the first pixel transistor region may be arranged symmetrical to the second demodulation node and the second pixel transistor region with respect to the center point of the detection region (e.g., detector). In addition, the first pixel PX1 and the second pixel PX2 may be arranged symmetrical to each other with respect to a boundary between the first pixel PX1 and the second pixel PX2. Accordingly, resistance components between the first demodulation node and the first pixel transistor region and resistance components between the second demodulation node and the second pixel transistor region are identical to each other in the overall pixel array 30. As a result, noise components included in the pixel signal of the first pixel transistor region and noise components included in the pixel signal of the second pixel transistor region are substantially identical to each other in the overall pixel array 30. Thus, the noise components can be easily removed or cancelled by the image processor (not shown) or others.

FIG. 6 is a schematic diagram illustrating another example of a layout structure 600 of the pixel array shown in FIG. 5 based on some implementations of the disclosed technology.

Referring to FIG. 6, the first pixel PX1 and the second pixel PX2 included in the layout structure 600 may correspond to the first pixel PX1 and the second pixel PX2 shown in FIG. 5, respectively. Constituent elements 610, 620-1, 620-2, 630-1, 630-2, 640, 650, 660, 670-1, 670-2, 680-1, 680-2, and 690 shown in FIG. 6 may correspond to the constituent elements 510, 520-1, 520-2, 530-1, 530-2, 540, 550, 560, 570-1, 570-2, 580-1, 580-2, and 590 shown in FIG. 5, respectively. Reference signs 621 to 626, 631 to 636, 681 to 686, 671 to 676, 642 and 692 are indicated to a terminal, respectively. Reference signs 641 and 691 are indicated to a voltage stabilization (VS) region, respectively.

The overall structures and functions of the constituent elements of the first pixel PX1 and the second pixel PX2 shown in the layout structure 600 shown in FIG. 6 are similar to those of the first pixel PX1 and the second pixel PX2 shown in the layout structure 400 shown in FIG. 4, and as such redundant description thereof will herein be omitted for brevity. For convenience of description, the differences of the constituent elements of the first and second pixels PX1 and PX2 shown in FIG. 6 will hereinafter be mainly described as compared to those of the layout structure 400 shown in FIG. 4.

The first pixel transistor region of the first pixel PX1 shown in FIG. 6 may be divided into two regions, i.e., the first pixel transistor region 620-1 and the first pixel transistor region 620-2, differently from the layout structure 400 shown in FIG. 4. That is, the first pixel transistor region 620-1 may include a first transistor group in which the reset transistor RX_A, the transfer transistor TX_A, and the floating diffusion (FD) transistor FDX_A are disposed. The first pixel transistor region 620-2 may include a second transistor group in which the selection transistor SX_A and the drive transistor DX_A are disposed.

Likewise, the second pixel transistor region of the first pixel PX1 shown in FIG. 6 may be divided into two regions, i.e., the second pixel transistor region 630-1 and the second pixel transistor region 630-2, differently from the layout structure 400 shown in FIG. 4. That is, the second pixel transistor region 630-1 may include a first transistor group in which the reset transistor RX_B, the transfer transistor TX_B, and the floating diffusion (FD) transistor FDX_B are disposed. The second pixel transistor region 630-2 may include a second transistor group in which the selection transistor SX_B and the drive transistor DX_B are disposed.

In the meantime, the arrangement order of transistors included in the first pixel transistor region 620-1 may be different from the arrangement order of transistors included in the second pixel transistor region 630-1. The arrangement order of transistors arranged in the direction from the left to the right of the first pixel transistor region 620-1 may be opposite to the arrangement order of transistors arranged in the direction from the left to the right of the second pixel transistor region 630-1.

Likewise, the arrangement order of transistors included in the first pixel transistor region 620-2 may be different from the arrangement order of transistors included in the second pixel transistor region 630-2. The arrangement order of transistors arranged in a downward direction of the first pixel transistor region 620-2 may be opposite to the arrangement order of transistors arranged in a downward direction of the second pixel transistor region 630-2.

The connection relationship of transistors included in the first pixel transistor regions 620-1 and 620-2 and the connection relationship of transistors included in the second pixel transistor regions 630-1 and 630-2 shown in FIG. 6 may be substantially identical to the connection relationship of the corresponding transistors shown in FIG. 4.

The arrangement and connection relationship of the first pixel transistor regions 670-1 and 670-2 and the second pixel transistor regions 680-1 and 680-2 of the second pixel PX2 are substantially identical to those of the first pixel transistor regions 620-1 and 620-2 and the second pixel transistor regions 630-1 and 630-2 of the first pixel PX1, and as such redundant description thereof will herein be omitted for brevity.

Figure 7:
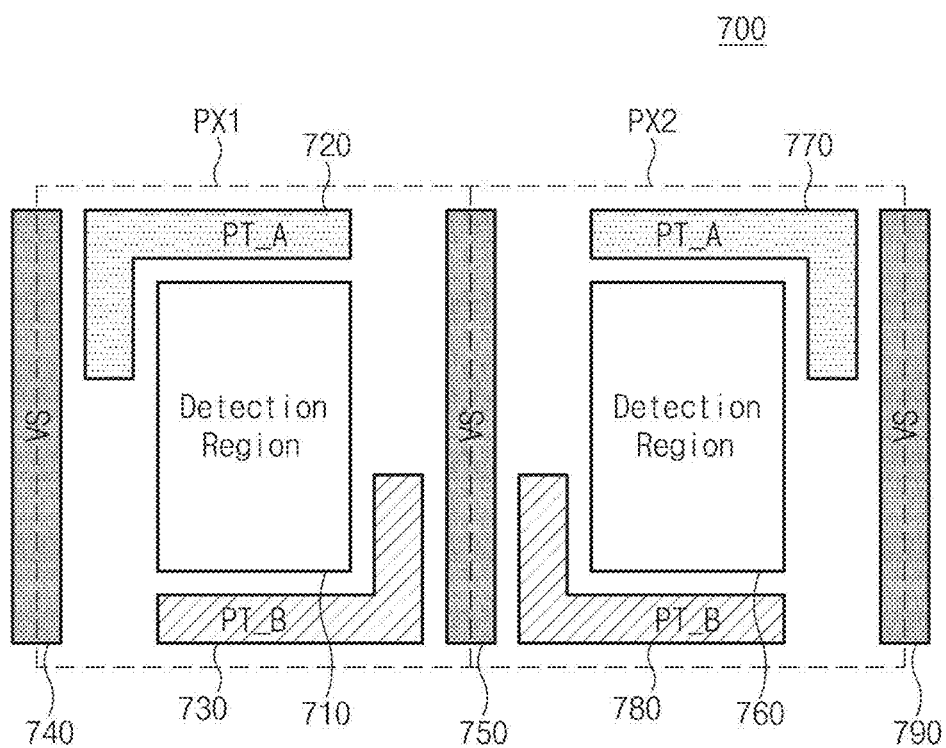
FIG. 7 is a block diagram illustrating another example of a layout structure of the pixel array shown in FIG. 1 based on some implementations of the disclosed technology.

FIG. 7 is a block diagram illustrating another example of a layout structure 700 of the pixel array shown in FIG. 1 based on some implementations of the disclosed technology.

Referring to FIG. 7, the layout structure 700 of the pixel array may include some pixels PX1 and PX2 of the pixel array 30 shown in FIG. 1. The remaining pixels of the pixel array 30 may also be implemented by the substantially same layout structure.

The first pixel PX1 may include a detection region 710, a first pixel transistor region 720, a second pixel transistor region 730, a first line region 740, and a second line region 750.

In FIG. 7, the remaining parts of the arrangement shape of the constituent elements included in the first pixel PX1 other than some characteristics different from those of the first pixel PX1 shown in FIG. 5 may be substantially identical to the arrangement shape of the constituent elements included in the first pixel PX1 shown in FIG. 5, and as such redundant description thereof will herein be omitted for brevity. Therefore, the different characteristics of the arrangement shape of the constituent elements included in the first pixel PX1 shown in FIG. 7 will hereinafter be mainly described as compared to those of FIG. 5 for convenience of description.

The first pixel transistor region 720 shown in FIG. 7 may have a shape that extends along two different sides of the detection region. The shape of the first pixel transistor region 720 may correspond to a shape obtained by combining the first pixel transistor regions 520-1 and 520-2 which are shown as isolated from each other in FIG. 5.

The second pixel transistor region 730 shown in FIG. 7 may have a shape that extends along two different sides of the detection region. The two sides along which the second pixel transistor region 730 is disposed are different from the two sides along which the first pixel transistor region 720 is disposed. The shape of the second pixel transistor region 730 may correspond to a shape obtained by combining the second pixel transistor regions 530-1 and 530-2 which are shown as isolated from each other in FIG. 5.

The second pixel PX2 may be arranged symmetrical to the first pixel PX1 with respect to a boundary between the first pixel PX1 and the second pixel PX2. The detailed description thereof will herein be omitted for brevity.

FIG. 8 is a schematic diagram illustrating another example of a layout structure 800 of the pixel array shown in FIG. 5 based on some implementations of the disclosed technology.

Referring to FIG. 8, the first pixel PX1 and the second pixel PX2 included in the layout structure 800 may correspond to the first pixel PX1 and the second pixel PX2 shown in FIG. 7, respectively. Constituent elements 810, 820, 830, 840, 850, 860, 870, 880, and 890 shown in FIG. 8 may correspond to the constituent elements 710, 720, 730, 740, 750, 760, 770, 780, and 790 shown in FIG. 7, respectively. Reference signs 822 to 827, 832 to 837, 682 to 687, 872 to 877, 842 and 892 are indicated to a terminal, respectively. Reference signs 841 and 891 are indicated to a voltage stabilization (VS) region, respectively.

The overall structures and functions of the constituent elements of the first pixel PX1 and the second pixel PX2 shown in the layout structure 800 shown in FIG. 8 are similar to those of the first pixel PX1 and the second pixel PX2 shown in the layout structure 600 shown in FIG. 6, and as such redundant description thereof will herein be omitted for brevity. For convenience of description, the constituent elements of the first and second pixels PX1 and PX2 shown in FIG. 8 will hereinafter be described center upon characteristics different from those of the layout structure 600 shown in FIG. 6.

The first pixel transistor region 820 of the first pixel PX1 may be formed in a shape that is formed by combination of the first pixel transistor region 620-1 and the first pixel transistor region 620-2, differently from FIG. 6. Since the drain of the reset transistor RX_A and the drain of the drive transistor DX_A in the first pixel transistor region 820-1 are designed to receive the same voltage (i.e., the pixel voltage Vpx), the drain of the reset transistor RX_A and the drain of the drive transistor DX_A in the first pixel transistor region 820-1 are integrated into one active region and receive the pixel voltage (Vpx) through the seventh terminal 827.

Likewise, the second pixel transistor region 830 of the first pixel PX1 may be formed in a shape that is formed by combination of the second pixel transistor region 630-1 and the second pixel transistor region 630-2, differently from FIG. 6. Since the drain of the reset transistor RX_A and the drain of the drive transistor DX_A in the second pixel transistor region 830-1 are designed to receive the same voltage (i.e., the pixel voltage Vpx), the drain of the reset transistor RX_A and the drain of the drive transistor DX_A in the second pixel transistor region 830-1 can be integrated into one active region and receive the pixel voltage (Vpx) through the seventh terminal 837.

The arrangement and connection relationship of the first pixel transistor region 870 and the second pixel transistor region 880 of the second pixel PX2 are substantially identical to those of the first pixel transistor region 820 and the second pixel transistor region 830 of the first pixel PX1, and as such redundant description thereof will herein be omitted for brevity.

Figure 9:
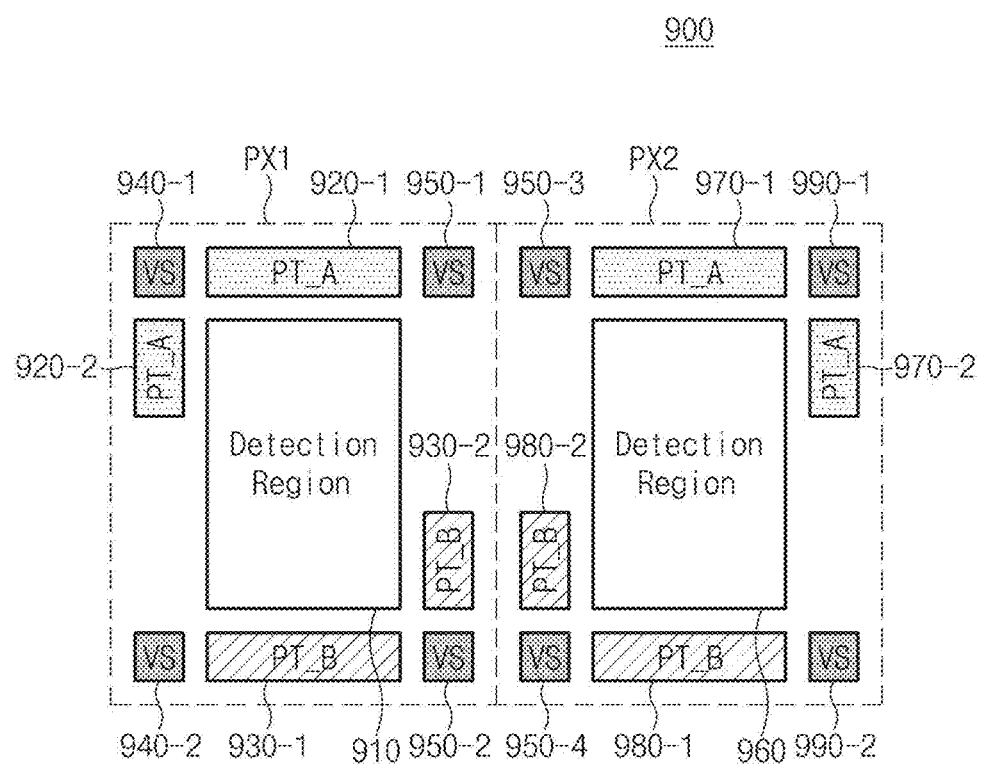
FIG. 9 is a block diagram illustrating another example of a layout structure of the pixel array shown in FIG. 1 based on some implementations of the disclosed technology.

FIG. 9 is a block diagram illustrating another example of a layout structure 900 of the pixel array shown in FIG. 1 based on some implementations of the disclosed technology.

Referring to FIG. 9, the layout structure 900 of the pixel array may include some pixels PX1 and PX2 of the pixel array 30 shown in FIG. 1. The remaining pixels of the pixel array 30 may also be implemented by the substantially same layout structure.

The first pixel PX1 may include a detection region 910, first pixel transistor regions 920-1 and 920-2, second pixel transistor regions 930-1 and 930-2, first line regions 940-1 and 940-2, and second line regions 950-1 and 950-2.

In FIG. 9, the arrangement shape of the constituent elements included in the first pixel PX1 has some differences from those of the first pixel PX1 shown in FIG. 5, while there are some parts substantially identical to the arrangement shape of the constituent elements included in the first pixel PX1 shown in FIG. 5. The redundant description thereof will herein be omitted for brevity. Therefore, the different characteristics of the arrangement shape of the constituent elements included in the first pixel PX1 shown in FIG. 9 will hereinafter be mainly described as compared to those of FIG. 5 for convenience of description.

The first line regions 940-1 and 940-2 may be divided into two line regions without being arranged along a boundary between the first pixel PX1 and the pixel disposed at the left side of the first pixel PX1 shown in FIG. 5, such that one line region may be disposed at the left side of the first pixel transistor region 920-1 and the other line region may be disposed at the left side of the second pixel transistor region 930-1.

In addition, the second line regions 950-1 and 950-2 may be divided into two line regions without being arranged along a boundary between the first pixel PX1 and the second pixel PX2 shown in FIG. 5, such that one line region may be disposed at the right side of the first pixel transistor region 920-1 and the other line region may be disposed at the right side of the second pixel transistor region 930-1.

As described above, the line regions are arranged to vertically overlap with the transistor regions, such that the region to be occupied by only one pixel can be reduced in size and each pixel can be miniaturized in a smaller size.

In the meantime, a voltage of the P-well region disposed below the pixel transistors included in the first pixel transistor regions 920-1 and 920-2 may be fixed by the voltage stabilization (VS) region of the first line region 940-1 and the second line region 950-1 that are located contiguous to the first pixel transistor regions 920-1 and 920-2.

In addition, a voltage of the P-well region disposed below the pixel transistors included in the second pixel transistor regions 930-1 and 930-2 may be fixed by the voltage stabilization (VS) region of the first line region 940-2 and the second line region 950-2 that are located contiguous to the second pixel transistor regions 930-1 and 930-2.

Although the first line regions 940-1 and 940-2 and the second line regions 950-1 and 950-2 are arranged in a different way from FIG. 5, the voltage of the P-well region disposed below the contiguous pixel transistor may be fixed or the operation of generating a hole current needed to collect photocharges in association with the contiguous control node may be carried out in the substantially same manner as in FIG. 5.

The second pixel PX2 may include a detection region 960, first pixel transistor regions 970-1 and 970-2, second pixel transistor regions 980-1 and 980-2, and other regions 950-3, 950-4, 990-1 and 990-2. The second pixel PX2 may be arranged symmetrical to the first pixel PX1 with respect to a boundary between the first pixel PX1 and the second pixel PX2, and as such a detailed description thereof will herein be omitted for brevity.

In addition, the remaining layout structures of the first pixel PX1 and the second pixel PX2 other than the above-mentioned differences are substantially identical to the layout structure of FIG. 6, and as such a detailed description thereof will herein be omitted for brevity.

Figure 10:
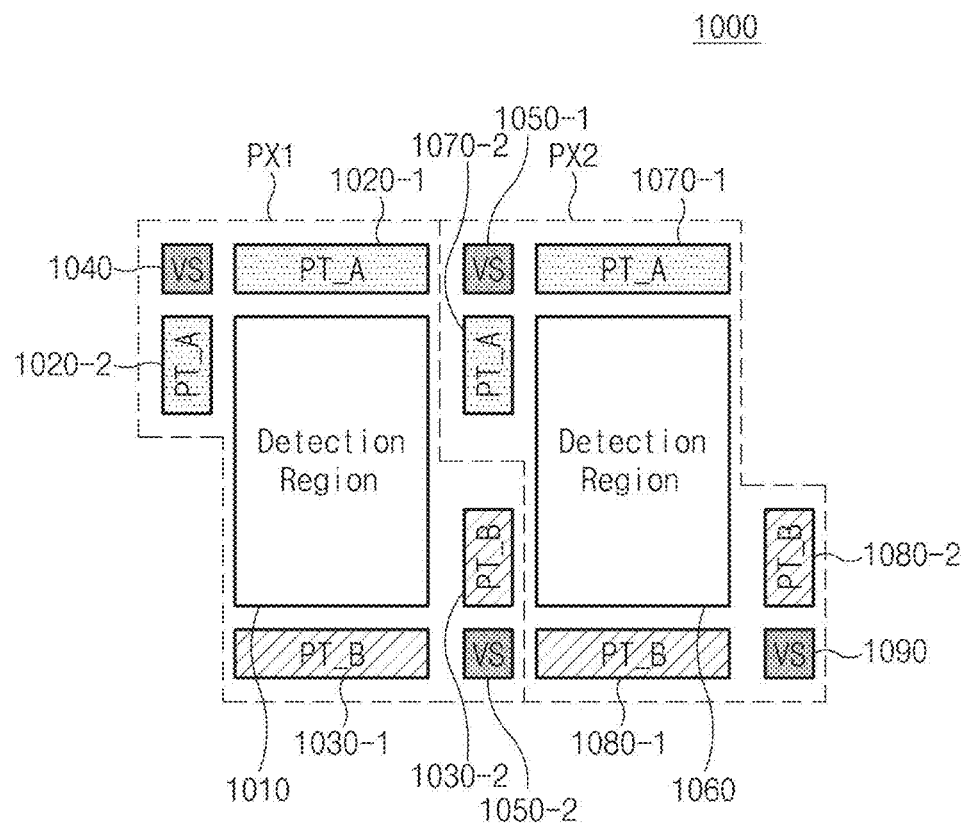
FIG. 10 is a schematic diagram illustrating another example of a layout structure of the pixel array shown in FIG. 1 based on some implementations of the disclosed technology.

FIG. 10 is a schematic diagram illustrating another example of a layout structure 1000 of the pixel array shown in FIG. 1 based on some implementations of the disclosed technology.

Referring to FIG. 10, the layout structure 1000 of the pixel array may include some pixels PX1 and PX2 of the pixel array 30 shown in FIG. 1. The remaining pixels of the pixel array 30 may also be implemented by the substantially same layout structure.

The first pixel PX1 may include a detection region 1010, first pixel transistor regions 1020-1 and 1020-2, second pixel transistor regions 1030-1 and 1030-2, a first line region 1040, and second line regions 1050-1 and 1050-2. The second pixel PX2 may include a detection region 1060, first pixel transistor regions 1070-1 and 1070-2, second pixel transistor regions 1080-1 and 1080-2, a second line region 1050-2 and other line region 1090.

In FIG. 10, the arrangement shape of the constituent elements included in the first pixel PX1 has some differences from those of the first pixel PX1 shown in FIG. 7, while there are some parts substantially identical to the arrangement shape of the constituent elements included in the first pixel PX1 shown in FIG. 7. The redundant description thereof will herein be omitted for brevity. Therefore, the different characteristics of the arrangement shape of the constituent elements included in the first pixel PX1 shown in FIG. 10 will hereinafter be mainly described as compared to those of FIG. 7 for convenience of description.

The first pixel PX1 shown in FIG. 10 may be formed in a shape that is formed by excluding the first line region 940-2 and the second line region 950-1 from the first pixel PX1 shown in FIG. 9. Therefore, the first pixel PX1 shown in FIG. 10 may not be formed in a rectangular shape, and may be formed in a shape in which the left side and the right side are bent.

At the position from which the first line region 940-2 is omitted, some line regions of the pixel located at the left side of the first pixel PX1 may be disposed, and some parts of the second pixel transistor region may be disposed over the some line regions. At the position from which the second line region 950-1 is omitted, the second line region 1050-1 of the second pixel PX2 may be disposed, and the first pixel transistor region 1070-2 may be disposed below the second line region 1050-1. That is, not only the second pixel transistor region 1030-2 and the second line region 1050-2 of the first pixel PX1, but also the first pixel transistor region 1070-2 and the second line region 1050-1 of the second pixel PX2 may be linearly arranged between the detection region 1010 of the first pixel PX1 and the detection region 1060 of the second pixel PX2.

As described above, the transistor regions and the line regions of different pixels are arranged to vertically overlap with each other, such that the region to be occupied by one pixel can be reduced in size and each pixel can be miniaturized in a smaller size.

The first line region 1040 may be disposed at a point where an extension line of the first pixel transistor region 1020-1 and an extension line of the first pixel transistor region 1020-2 are arranged to cross each other, and the second line region 1050-2 may be disposed at a point where an extension line of the second pixel transistor region 1030-1 and an extension line of the second pixel transistor region 1030-2 are arranged to cross each other. Therefore, the voltage stabilization (VS) regions of the first line region 1040 and the second line region 1050-2 can more effectively fix the voltage of the P-well region disposed below the contiguous pixel transistor.

The second pixel PX2 may be constructed to correspond to the first pixel PX1, and as such a detailed description thereof will herein be omitted for brevity.

Figure 11:
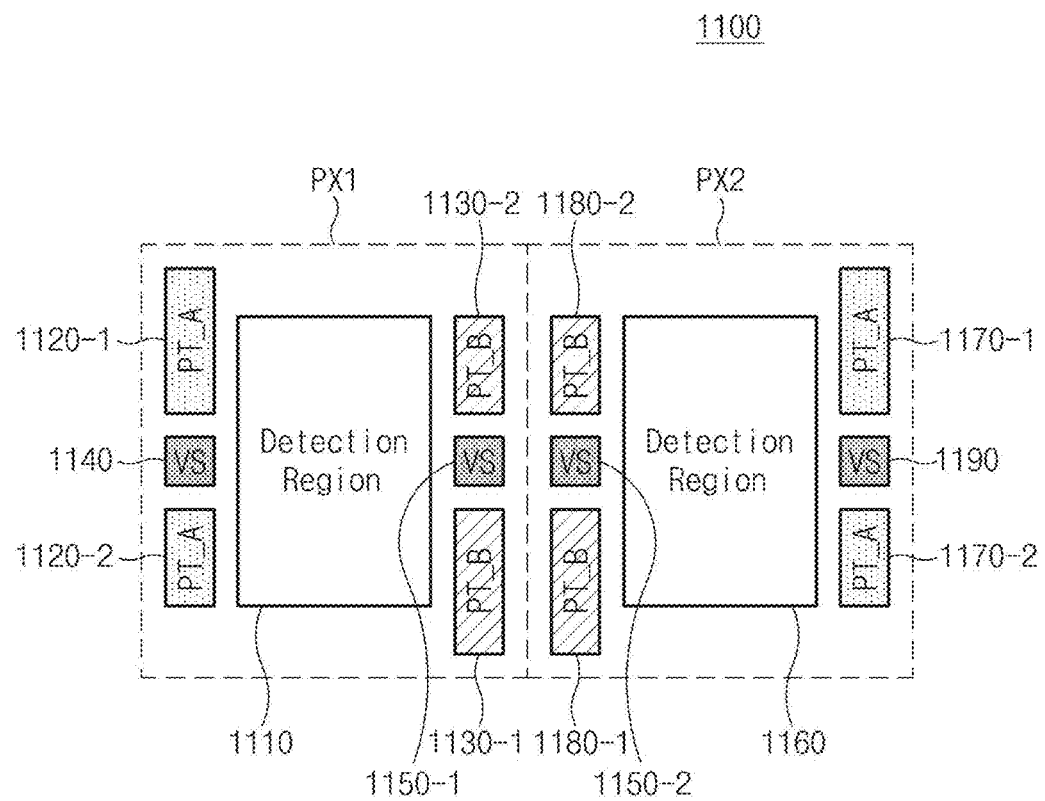
FIG. 11 is a schematic diagram illustrating another example of a layout structure of the pixel array shown in FIG. 1 based on some implementations of the disclosed technology.

FIG. 11 is a schematic diagram illustrating another example of a layout structure 1100 of the pixel array shown in FIG. 1 based on some implementations of the disclosed technology.

Referring to FIG. 11, the layout structure 1100 of the pixel array may include some pixels PX1 and PX2 of the pixel array 30 shown in FIG. 1. The remaining pixels of the pixel array 30 may also be implemented by the substantially same layout structure.

The first pixel PX1 may include a detection region 1110, first pixel transistor regions 1120-1 and 1120-2, second pixel transistor regions 1130-1 and 1130-2, a first line region 1140, and a second line region 1150-1.

In FIG. 11, the arrangement shape of the constituent elements included in the first pixel PX1 has some differences from those of the first pixel PX1 shown in FIG. 3, while there are some parts substantially identical to the arrangement shape of the constituent elements included in the first pixel PX1 shown in FIG. 3. The redundant description thereof will herein be omitted for brevity. Therefore, the different characteristics of the arrangement shape of the constituent elements included in the first pixel PX1 shown in FIG. 11 will hereinafter be mainly described as compared to those of FIG. 3 for convenience of description.

The first line region 1140 may not be disposed along a boundary between the first pixel PX1 and the pixel disposed at the left side of the first pixel PX1 as shown in FIG. 3, and may be disposed between the first pixel transistor region 1120-1 and the first pixel transistor region 1120-2 isolated from each other.

The second line region 1150-1 may not be disposed along a boundary between the first pixel PX1 and the second pixel PX2 as shown in FIG. 3, and may be disposed between the second pixel transistor region 1130-1 and the second pixel transistor region 1130-2 isolated from each other.

As described above, the line regions are arranged to vertically overlap with the transistor regions, such that the region to be occupied by one pixel can be reduced in size and each pixel can be miniaturized in a smaller size.

The voltage of the P-well region disposed below the pixel transistor included in the first pixel transistor regions 1120-1 and 1120-2 may be fixed by the voltage stabilization (VS) region of the first line region 1140 located contiguous to the first pixel transistor regions 1120-1 and 1120-2.

In addition, the voltage of the P-well region disposed below the pixel transistor included in the second pixel transistor regions 1130-1 and 1130-2 may be fixed by the voltage stabilization (VS) region of the second line region 1150-1 located contiguous to the second pixel transistor regions 1130-1 and 1130-2.

Although the first line region 1140 and the second line region 1150-1 are arranged in a different way from FIG. 3, the voltage of the P-well region disposed below the contiguous pixel transistor may be fixed or the operation of generating a hole current needed to collect photocharges in association with the contiguous control node may be carried out in the substantially same manner as in FIG. 3.

The first line region 1140 may be disposed between the first pixel transistor region 1120-1 and the first pixel transistor region 1120-2, and the second line region 1150-1 may be disposed between the second pixel transistor region 1130-1 and the second pixel transistor region 1130-2. Therefore, the voltage stabilization (VS) regions of the first line region 1140 and the second line region 1150-1 can more effectively fix the voltage of the P-well region disposed below the contiguous pixel transistor.

The first pixel transistor region 1120-1 may correspond to the reset transistor RX_A, the transfer transistor TX_A, and the floating diffusion (FD) transistor FDX_A of the first pixel transistor region 420 shown in FIG. 4. The first pixel transistor region 1120-2 may correspond to the drive transistor DX_A and the selection transistor SX_A of the first pixel transistor region 420 shown in FIG. 4. The second pixel transistor region 1130-1 may correspond to the reset transistor RX_A, the transfer transistor TX_A, and the floating diffusion (FD) transistor FDX_A of the second pixel transistor region 430 shown in FIG. 4, and the second pixel transistor region 1130-2 may correspond to the drive transistor DX_A and the selection transistor SX_A of the second pixel transistor region 430 shown in FIG. 4.

The first pixel transistor regions 1120-1 and 1120-2 are arranged symmetrical to the second pixel transistor regions 1130-1 and 1130-2 with respect to the center point of the detection region 1110, such that the first pixel PX1 shown in FIG. 11 may have the substantially same characteristics as those of resistance components shown in FIG. 4.

The second pixel PX2 may include a detection region 1160, first pixel transistor regions 1170-1 and 1170-2, second pixel transistor regions 1180-1 and 1180-2, and other line regions 1150-2 and 1190. The second pixel PX2 may be arranged symmetrical to the first pixel PX1 with respect to a boundary between the first pixel PX1 and the second pixel PX2, and as such a detailed description thereof will herein be omitted for brevity.

In addition, the remaining layout structures of the first pixel PX1 and the second pixel PX2 other than the above-mentioned differences are substantially identical to the layout structure of FIG. 4, and as such a detailed description thereof will herein be omitted for brevity.

In some implementations of the disclosed technology, the first pixel transistor region and the second pixel transistor region in the CAPD pixel are respectively disposed at one side and the other side (e.g., left side and right side, upper side and lower side, etc.) in the CAPD pixel, such that mutual interference between the first pixel transistor region and the second pixel transistor region can be minimized, and deterioration of pixel performance can be prevented irrespective of reduction in pixel size. In this case, although the expression "one side" and the expression "the other side" can be distinguished from each other with respect to a virtual straight line passing through the center point of the detection region, the scope or spirit of the disclosed technology is not limited thereto, the first pixel transistor region and the second pixel transistor region need not always be distinguished from each other with respect to the straight line, and a main region of the first pixel transistor region and a main region of the second pixel transistor region may also be classified into one side and the other side as necessary.

In addition, in the CAPD pixel, the first demodulation node and the first pixel transistor region may be arranged symmetrical to the second demodulation node and the second pixel transistor region with respect to the center point of the detection region, the first pixel and the second pixel contiguous or adjacent to the first pixel may be arranged symmetrical to each other with respect to a boundary between the first pixel and the second pixel, noise components of each pixel may remain constant in the overall pixel array 30, such that noise cancellation can be easily carried out. The symmetric arrangement may refer to the arrangement generally providing some symmetry between two corresponding elements in the first pixel and the second pixel.

In addition, the voltage stabilization (VS) regions may be properly arranged contiguous to pixel transistors, such that the pixel transistors can stably operate.

In accordance with various embodiments, each (e.g., a module or program) of the above-mentioned constituent elements may include one or more entities. In accordance with various embodiments, at least one constituent element from among the above-mentioned constituent elements or at least one operation may be omitted, or one or more other constituent elements or one or more other operations may be added. Alternatively or additionally, the plurality of constituent elements (e.g., modules or programs) may be integrated into only one constituent element. In this case, the integrated constituent element may perform one or more functions of each of the plurality of constituent elements in the same way as or in a similar way to the previous operation that has been executed by the corresponding constituent element from among the plurality of constituent elements prior to execution of such integration. According to various embodiments, operations performed by a module, a program, or another constituent element may be sequentially, parallelly, repeatedly, or heuristically executed, at least one of the above operations may be executed in different order or omitted, or another operation may be added.

As is apparent from the above description, the image sensor based on some implementations of the disclosed technology can enable the first pixel transistor region and the second pixel transistor region included in the CAPD pixel to be respectively disposed at one side and the other side, such that the first pixel transistor region is disposed at one side and the second pixel transistor region is disposed at the other side. As a result, mutual interference between the first pixel transistor region and the second pixel transistor pixel can be minimized, and performance (or throughput) of pixels can be prevented from decreasing irrespective of reduction in pixel size.

The embodiments of the disclosed technology may provide a variety of effects capable of being directly or indirectly recognized through the above-mentioned patent document.

Although a number of illustrative embodiments of the disclosed technology have been described, it should be understood that numerous other modifications and embodiments can be made based on what is disclosed in this patent document.

What is claimed is:

1. An image sensor comprising:
   a detection region structured to include a first demodulation node and a second demodulation node to generate an electric current in a substrate and capture photocharges that are generated in response to incident light in the substrate and move along the electric current;
   a first pixel transistor region disposed at one side of the detection region, and configured to include a plurality of transistors processing the photocharges captured by the first demodulation node; and
   a second pixel transistor region disposed at other side of the detection region, and configured to include a plurality of transistors processing the photocharges captured by the second demodulation node.

2. The image sensor according to claim 1, wherein the first pixel transistor region includes a first P-well region in contact with a voltage stabilization region disposed adjacent to the first pixel transistor region; and
   the second pixel transistor region includes a second P-well region in contact with another voltage stabilization region disposed adjacent to the second pixel transistor region.

3. The image sensor according to claim 2, wherein:
   the another voltage stabilization region disposed at the other side of the detection region is in contact with another P-well region disposed below a first pixel transistor region of a contiguous pixel disposed at one side of the second pixel transistor region.

4. The image sensor according to claim 2, wherein:
   the voltage stabilization region and the another voltage stabilization region are configured to receive a ground voltage.

5. The image sensor according to claim 1, wherein:
   the first demodulation node and the first pixel transistor region are arranged symmetrical to the second demodulation node and the second pixel transistor region with respect to a center of the detection region, respectively.

6. The image sensor according to claim 1, wherein:
   each of the first pixel transistor region and the second pixel transistor region includes a first transistor group including a reset transistor and a transfer transistor, and a second transistor group including a selection transistor and a drive transistor.

7. The image sensor according to claim 1, wherein:
   the one side and the other side are opposite sides of the detection region.

8. The image sensor according to claim 6, wherein the first transistor group is disposed over the second transistor group in each of the first pixel transistor region and the second pixel transistor region.

9. The image sensor according to claim 6, further comprising:
   a voltage stabilization region disposed between the first transistor group and the second transistor group of the first pixel transistor region or the second pixel transistor region, and doped with P-type impurities.

10. The image sensor according to claim 6, wherein:
    the first transistor group and the second transistor group of the first pixel transistor region are disposed on two different sides of the detection region.

11. The image sensor according to claim 10, wherein:
the first transistor group and the second transistor group of the second pixel transistor region are disposed on two different sides of the detection region.

12. The image sensor according to claim 11, wherein:
in the first pixel transistor region or the second pixel transistor region, a reset transistor of the first transistor group and a drive transistor of the second transistor group are coupled to each other.

13. The image sensor according to claim 11, further comprising:
a voltage stabilization region disposed at a left side of the second transistor group of the first pixel transistor region or at a right side of the second transistor group of the second pixel transistor region, and doped with P-type impurities.

14. The image sensor according to claim 11, further comprising:
a voltage stabilization region disposed in the first pixel transistor region or the second pixel transistor region and at left and right sides of the first transistor group of the first pixel transistor region or the second pixel transistor region, the voltage stabilization region doped with P-type impurities.

15. The image sensor according to claim 11, further comprising:
a voltage stabilization region disposed in the first pixel transistor region or the second pixel transistor region and at a crossing point where an extension line of the first transistor group and an extension line of the second transistor group cross each other, the voltage stabilization region doped with P-type impurities.

16. The image sensor according to claim 15, wherein:
the second transistor group and the voltage stabilization region of the second pixel transistor region are arranged to vertically overlap with a second transistor group of a first pixel transistor region of a pixel disposed at the other side of the detection region.

17. The image sensor according to claim 1, wherein:
the first demodulation node and the second demodulation node are arranged along a diagonal line having a predetermined angle with respect to one side of the detection region.

18. The image sensor according to claim 17, wherein:
the first demodulation node includes a first control node to receive a first demodulation control signal and the second demodulation node includes a second control node to receive a second demodulation control signal, and
each of the first control node and the second control node has a first side having a length longer than other sides of each of the first control node and the second control node.

19. The image sensor according to claim 18, wherein the first sides of the first control node and the second control node are arranged to face each other.

20. An image sensor comprising:
a first pixel that is structured to detect light to produce a first pixel output signal; and
a second pixel located contiguous to the first pixel and structured to detect light to produce a second pixel output signal separate from the first pixel output signal,
wherein each of the first pixel and the second pixel comprises:
a detection region including a first demodulation node and a second demodulation node and configured to generate an electric current in a substrate and capture photocharges that are generated in response to incident light and move along the electric current;
a first pixel transistor region disposed at one side of the detection region, and configured to include a plurality of transistors processing the photocharges captured by the first demodulation node; and
a second pixel transistor region disposed at other side of the detection region, and configured to include a plurality of transistors processing the photocharges captured by the second demodulation node,
wherein the detection region, the first pixel transistor region, and the second pixel transistor region of the first pixel are arranged symmetrical to the detection region, the first pixel transistor region, and the second pixel transistor region of the second pixel with respect to a boundary between the first pixel and the second pixel.

* * * * *